United States Patent
Oshiki

(10) Patent No.: US 12,341,102 B2
(45) Date of Patent: Jun. 24, 2025

(54) SEMICONDUCTOR STORAGE DEVICE AND MANUFACTURING METHOD THEREOF

(71) Applicant: Kioxia Corporation, Tokyo (JP)

(72) Inventor: Yusuke Oshiki, Kuwana (JP)

(73) Assignee: Kioxia Corporation, Tokyo (JP)

( * ) Notice: Subject to any disclaimer, the term of this patent is extended or adjusted under 35 U.S.C. 154(b) by 590 days.

(21) Appl. No.: 17/654,293

(22) Filed: Mar. 10, 2022

(65) Prior Publication Data

US 2022/0199533 A1 Jun. 23, 2022

Related U.S. Application Data

(63) Continuation of application No. PCT/JP2019/036213, filed on Sep. 13, 2019.

(51) Int. Cl.
*H01L 23/535* (2006.01)
*H10B 43/27* (2023.01)

(52) U.S. Cl.
CPC ........... *H01L 23/535* (2013.01); *H10B 43/27* (2023.02)

(58) Field of Classification Search
CPC ........ H10B 43/27; H10B 41/27; H10B 43/10; H10B 41/10; H01L 23/535; H10D 30/6891–6894
See application file for complete search history.

(56) References Cited

U.S. PATENT DOCUMENTS

| | | | |
|---|---|---|---|
| 8,436,414 B2 | 5/2013 | Tanaka et al. | |
| 8,896,051 B2 | 11/2014 | Nansei | |
| 9,159,613 B2 | 10/2015 | Akutsu et al. | |
| 9,466,611 B2 | 10/2016 | Komori et al. | |
| 10,692,881 B2 | 6/2020 | Hwang et al. | |
| 2010/0019310 A1 | 1/2010 | Sakamoto | |
| 2011/0309432 A1 | 12/2011 | Ishihara et al. | |
| 2013/0228850 A1 | 9/2013 | Tanaka et al. | |

(Continued)

FOREIGN PATENT DOCUMENTS

| | | |
|---|---|---|
| JP | 2010-192569 A | 9/2010 |
| JP | 2011-060958 A | 3/2011 |
| JP | 2013-131580 A | 7/2013 |

(Continued)

OTHER PUBLICATIONS

International Search Report issued Nov. 19, 2019 in PCT/JP2019/036213 filed on Sep. 13, 2019, 2 pages.

*Primary Examiner* — Wasiul Haider
(74) *Attorney, Agent, or Firm* — Oblon, McClelland, Maier & Neustadt, L.L.P.

(57) ABSTRACT

A semiconductor storage device according to an embodiment includes: a first stacked body including a plurality of first electrode layers and a plurality of first insulating layers that are alternately stacked on a substrate in a first direction perpendicular to the substrate; a plurality of semiconductor films penetrating the first stacked body in the first direction; a second stacked body including a plurality of second electrode layers and a plurality of second insulating layers that are alternately stacked on the first stacked body in the first direction; and a plurality of contact plugs penetrating the second stacked body in the first direction and separately connected to the respective plurality of semiconductor films and the respective plurality of second electrode layers.

6 Claims, 26 Drawing Sheets

(56) References Cited

U.S. PATENT DOCUMENTS

2016/0079270 A1* 3/2016 Komori .................. H10B 43/35
257/314

FOREIGN PATENT DOCUMENTS

| JP | 2015-046425 A | 3/2015 |
| JP | 2016-062952 A | 4/2016 |
| JP | 2018-163981 A | 10/2018 |
| JP | 2019-004146 A | 1/2019 |

* cited by examiner

SEMICONDUCTOR STORAGE DEVICE AND MANUFACTURING METHOD THEREOF

CROSS-REFERENCE TO RELATED APPLICATIONS

This application is based upon and claims the benefit of priority from PCT Application No. PCT/JP2019/036213, filed on Sep. 13, 2019; the entire contents of which are incorporated herein by reference.

FIELD

Embodiments of the present invention relate to a semiconductor storage device and a manufacturing method thereof.

BACKGROUND

A three-dimensional stacked semiconductor memory, which is an example of a semiconductor storage device, includes a stacked body where a first electrode layer, which functions as a word line, is stacked. A semiconductor film, which functions as a channel, is formed in the stacked body. In addition, a second electrode layer, which functions as a bit line, is located on the stacked body and electrically connected to the semiconductor film.

DETAILED DESCRIPTION

Embodiments of the present invention will be described below with reference to the drawings. The present embodiments by no means limit the present invention.

A semiconductor storage device according to an embodiment includes: a first stacked body including a plurality of first electrode layers and a plurality of first insulating layers that are alternately stacked on a substrate in a first direction perpendicular to the substrate; a plurality of semiconductor films penetrating the first stacked body in the first direction; a second stacked body including a plurality of second electrode layers and a plurality of second insulating layers that are alternately stacked on the first stacked body in the first direction; and a plurality of contact plugs penetrating the second stacked body in the first direction and separately connected to the respective plurality of semiconductor films and the respective plurality of second electrode layers.

First Embodiment

Figure 1:
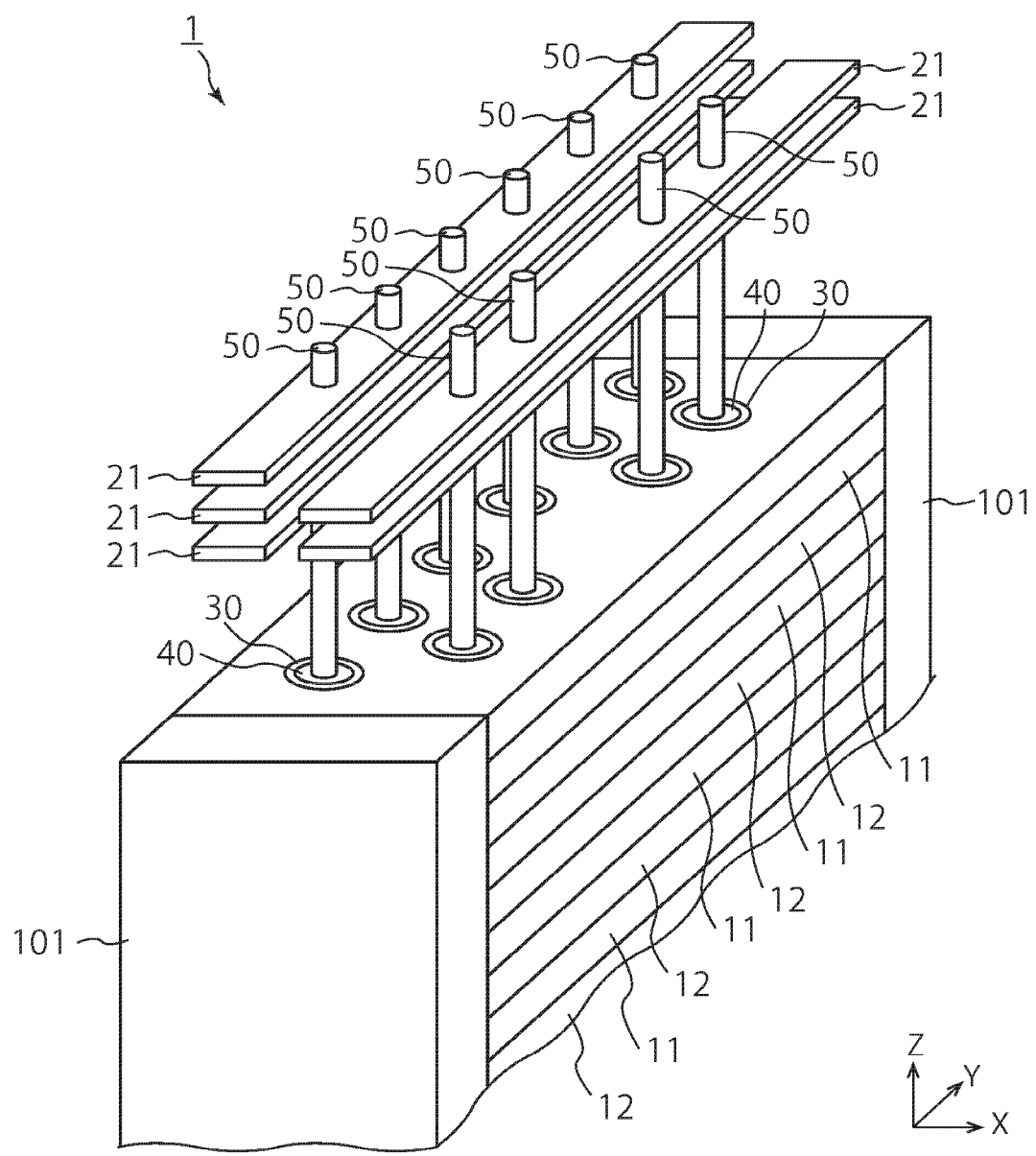
FIG. 1 is a perspective view illustrating a structure of a main part of a semiconductor storage device according to a first embodiment.
Figure 2A:
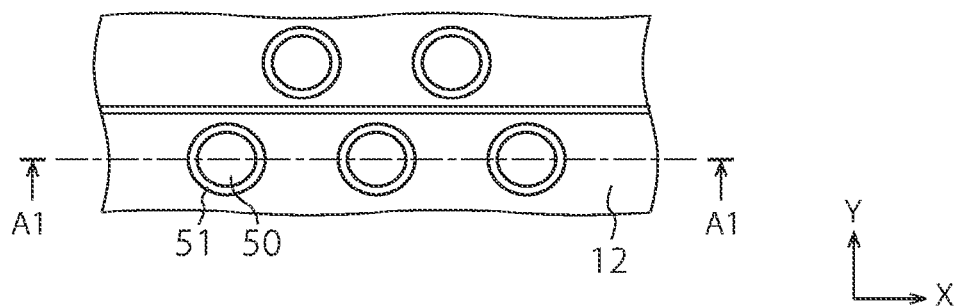
FIG. 2A is a schematic plan view of the semiconductor storage device according to the first embodiment.
Figure 2B:
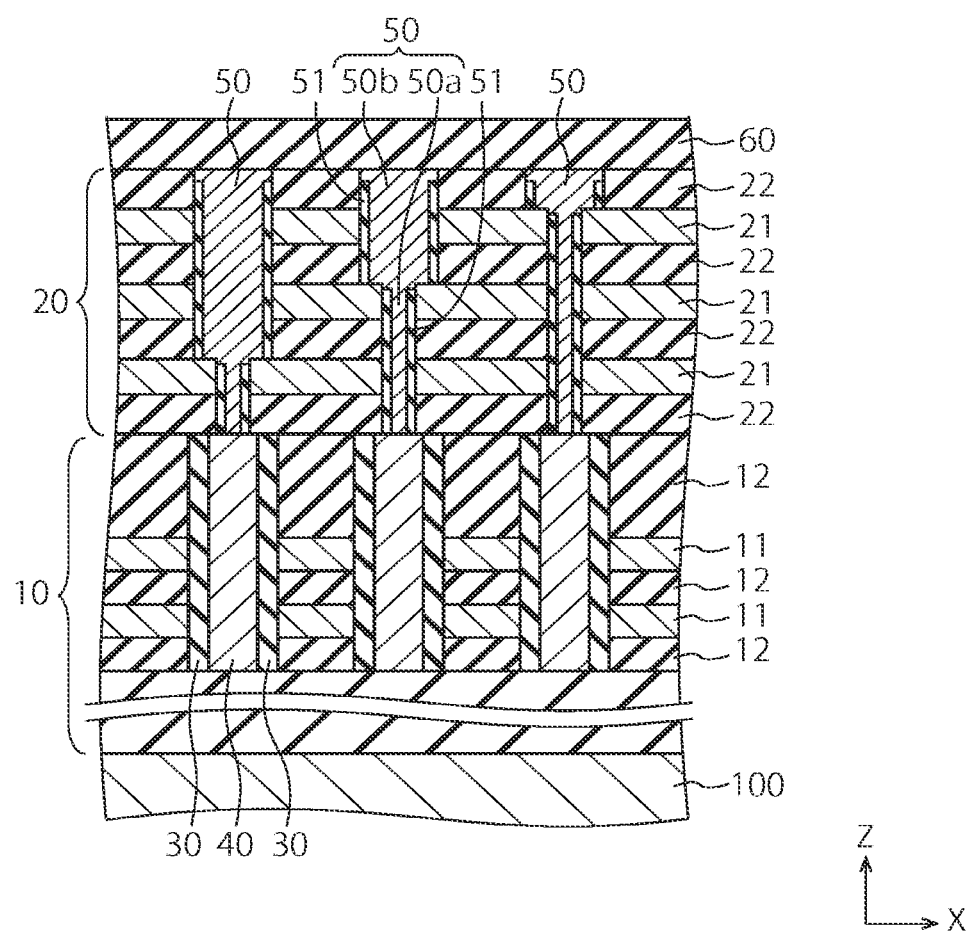
FIG. 2B is a cross sectional view taken along a section line A1-A1 in FIG. 2A.

FIG. 1 is a schematic perspective view of a semiconductor storage device according to a first embodiment. FIG. 2A is a schematic plan view of the semiconductor storage device according to the first embodiment. FIG. 2B is a cross sectional view taken along a section line A1-A1 in FIG. 2A. In the figures, a direction perpendicular to a substrate 100 is referred to as a Z-direction (a first direction). Meanwhile, two directions parallel to the substrate 100 and orthogonal to each other are referred to as an X-direction (a third direction) and a Y-direction (a second direction).

A semiconductor storage device 1 according to the present embodiment includes a first stacked body 10, a second stacked body 20, a plurality of memory films 30, a plurality of semiconductor films 40, and a plurality of contact plugs 50.

The first stacked body 10 is provided on the substrate 100. The substrate 100 is, for example, a silicon substrate. The first stacked body 10 includes first electrode layers 11 and first insulating layers 12 alternately stacked in the Z-direction. The first electrode layers 11, which contain, for example, tungsten (W), function as word lines. The first insulating layers 12 contain, for example, silicon oxide (SiO$_2$). In the present embodiment, opposite ends of the first stacked body 10 in the Y-direction are provided with respective slit films 101 as illustrated in FIG. 1. The slit films 101 cause the first stacked body 10 to be divided.

The second stacked body 20 is provided on the first stacked body 10. The second stacked body 20 includes second electrode layers 21 and second insulating layers 22 alternately stacked in the Z-direction. The second electrode layers 21, which contain, for example, tungsten, function as bit lines. The second insulating layers 22 contain, for example, silicon oxide. An upper surface of each of the second insulating layers 22 is covered with a protecting film 60. The protecting film 60 contains, for example, silicon oxide. It should be noted that illustration of the second insulating layers 22 and the protecting film 60 is omitted in FIG. 1.

Figure 3:
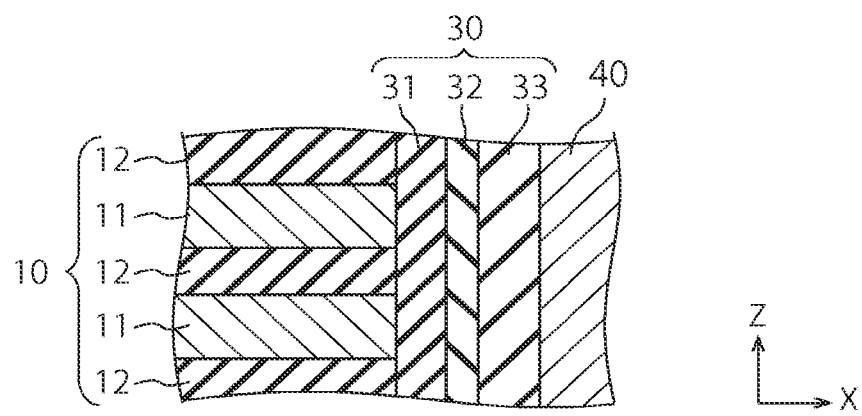
FIG. 3 is an enlarged cross sectional view of a part of a memory film and a semiconductor film.

FIG. 3 is an enlarged cross sectional view of a part of the memory films 30 and the semiconductor films 40. The memory films 30 and the semiconductor films 40 penetrate through the first stacked body 10 in the Z-direction. In addition, the memory films 30 each include a block insulating film 31, a charge accumulating film 32, and a tunnel insulating film 33.

The block insulating film 31, which contains, for example, silicon oxide, faces the first electrode layers 11 and the first insulating layers 12. The charge accumulating film 32, which contains, for example, silicon nitride (SiN), faces an inner circumferential surface of the block insulating film 31. The tunnel insulating film 33, which contains, for example, silicon oxynitride (SiON), faces an inner circumferential surface of the charge accumulating film 32.

The semiconductor films 40, which contain, for example, polysilicon, each face an inner circumferential surface of the tunnel insulating film 33. The semiconductor films 40 are each electrically connected to one of the plurality of second electrode layers 21 through the contact plug 50 as illustrated in FIG. 2B.

In the present embodiment, the plurality of memory films 30 and the plurality of semiconductor films 40 are arranged along the Y-direction as illustrated in FIG. 1. In addition, a plurality of rows of the memory films 30 and the semiconductor films 40 are arranged in the X-direction.

The contact plugs 50 penetrate through the second stacked body 20 in the Z-direction as illustrated in FIG. 2B. In addition, the contact plugs 50 each include a first columnar portion 50$a$ and a second columnar portion 50$b$. The first columnar portion 50$a$ and the second columnar portion 50$b$ each contain, for example, a metal such as aluminum.

A lower end of the first columnar portion 50$a$ is connected to the semiconductor film 40. An upper end of the first columnar portion 50$a$ is connected to a lower end of the second columnar portion 50$b$. The second columnar portion 50$b$ has a larger diameter than the first columnar portion 50$a$. The contact plugs 50 are each connected to one of the plurality of second electrode layers 21 at a boundary portion between the first columnar portion 50$a$ and the second columnar portion 50$b$.

To separately connect the plurality of contact plugs 50 and the plurality of second electrode layers 21 as described above, side surfaces of the first columnar portions 50$a$ and the second columnar portions 50$b$ are each covered with an insulating film 51. By virtue of the insulating film 51, the contact plugs 50 are each insulated from the second electrode layers 21 except one to be connected.

In addition, in the present embodiment, as for a length in the Z-direction, the first columnar portion 50$a$ of the contact plug 50 connected to lower one of the second electrode layers 21 is shorter than the second columnar portion 50$b$ thereof. In contrast, the first columnar portion 50$a$ of the contact plug 50 connected to upper one of the second electrode layers 21 is longer than the second columnar portion 50$b$ thereof.

A manufacturing method of the above-described semiconductor storage device 1 according to the present embodiment will be described below.

Figure 4A:
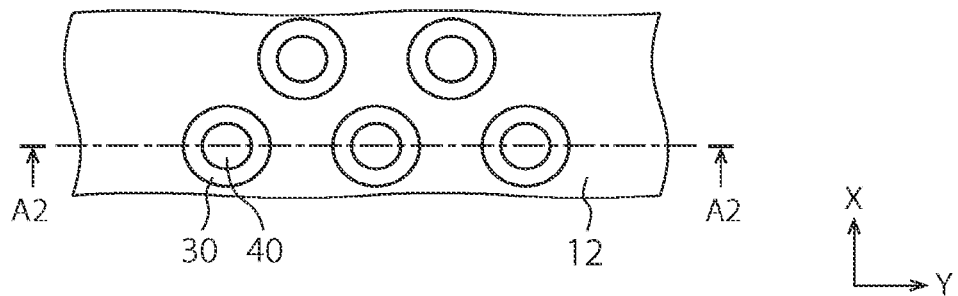
FIG. 4A is a plan view illustrating a formation process of a first stacked body, the memory film, and the semiconductor film.
Figure 4B:
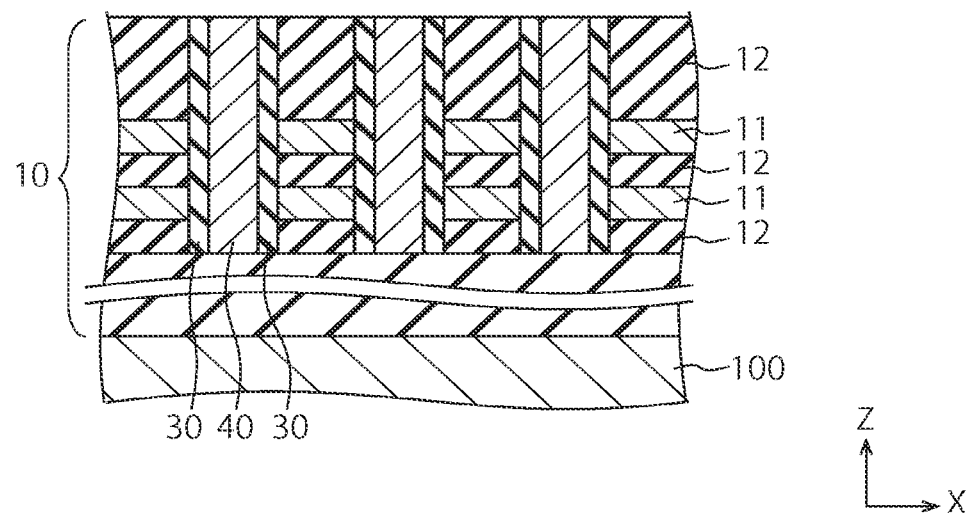
FIG. 4B is a cross sectional view taken along a section line A2-A2 in FIG. 4A.

First, the first stacked body 10, the memory films 30, and the semiconductor films 40 are formed on the substrate 100 as illustrated in FIG. 4A and FIG. 4B. The first stacked body 10 can be formed by, for example, chemical vapor deposition (CVD) or atomic layer deposition (ALD). The memory films 30 and the semiconductor films 40 can be formed in memory holes formed in the first stacked body 10.

Figure 5A:
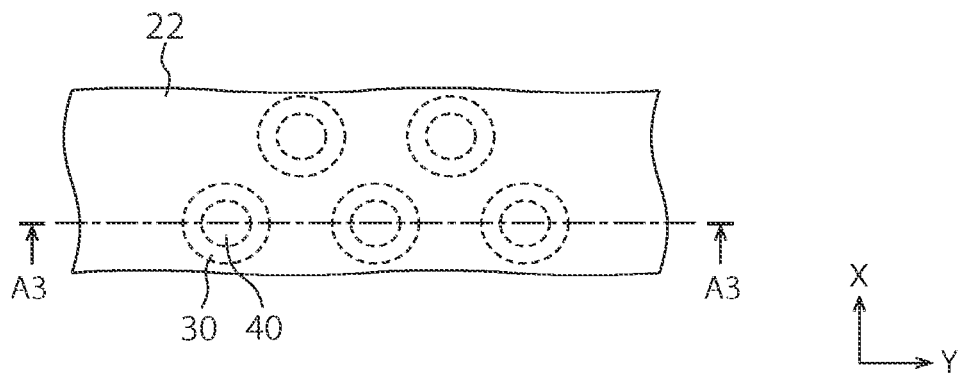
FIG. 5A is a plan view illustrating a formation process of a second stacked body.
Figure 5B:
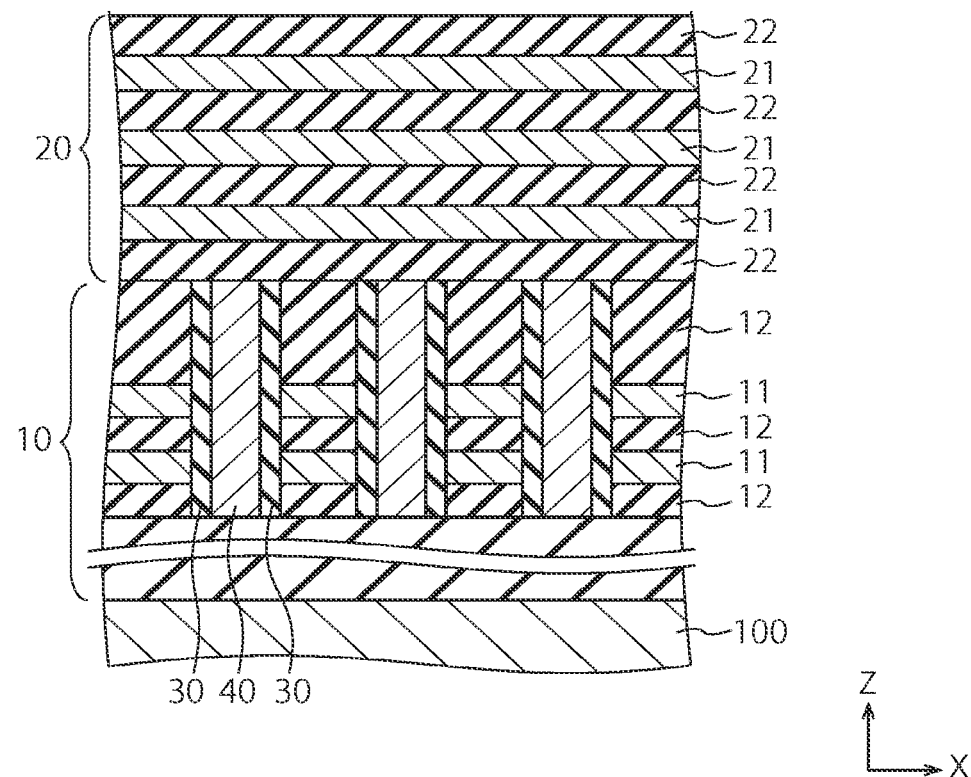
FIG. 5B is a cross sectional view taken along a section line A3-A3 in FIG. 5A.

Next, the second stacked body 20 is formed on the first stacked body 10 as illustrated in FIG. 5A and FIG. 5B. The second stacked body 20 can also be formed by CVD or ALD in the same manner as the first stacked body 10.

Figure 6A:
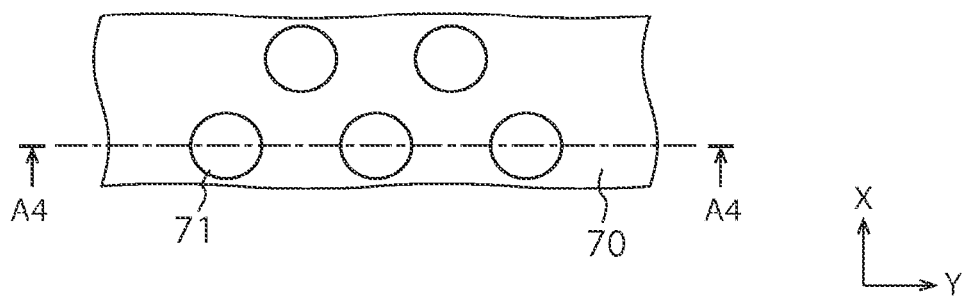
FIG. 6A is a plan view of a formation process of a mask.
Figure 6B:
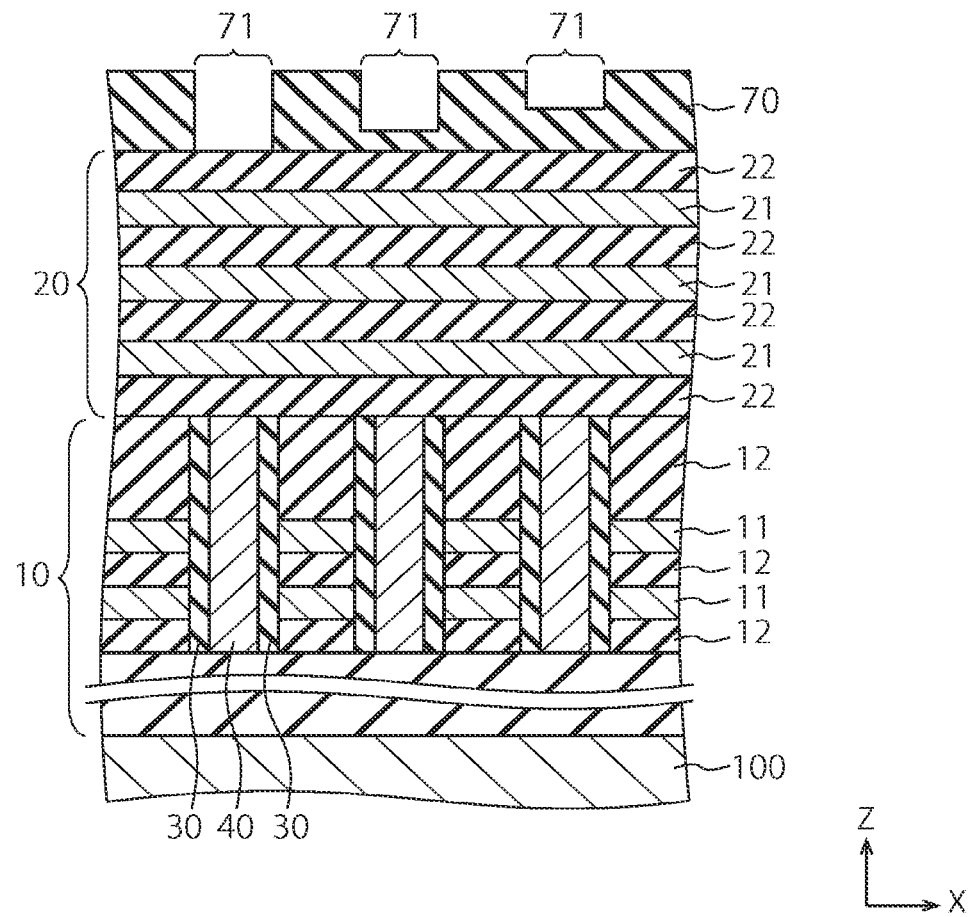
FIG. 6B is a cross sectional view taken along a section line A4-A4 in FIG. 6A.

Next, a mask 70 is formed on the second stacked body 20 as illustrated in FIG. 6A and FIG. 6B. A plurality of hole portions 71 with respective different depths are formed in the mask 70 in order to form the second columnar portions 50$b$ of the contact plug 50. The mask 70 is, for example, a resist. In addition, a pattern of the hole portions 71 can be formed by, for example, a nanoimplant technique. That is to say, the pattern of the hole portions 71 can be formed by transferring a projection/recess pattern of a template to the mask 70.

Figure 7A:
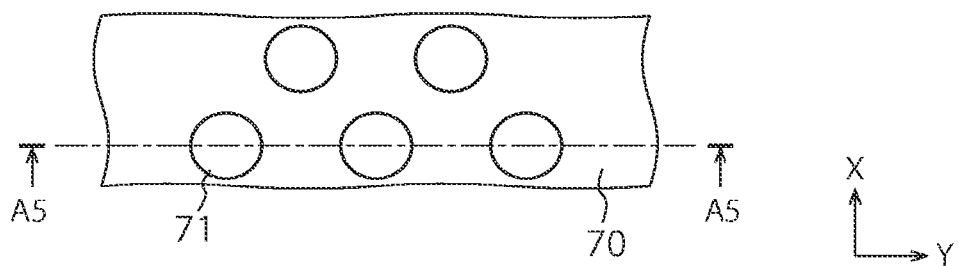
FIG. 7A is a plan view illustrating a formation process of a first contact hole.
Figure 7B:
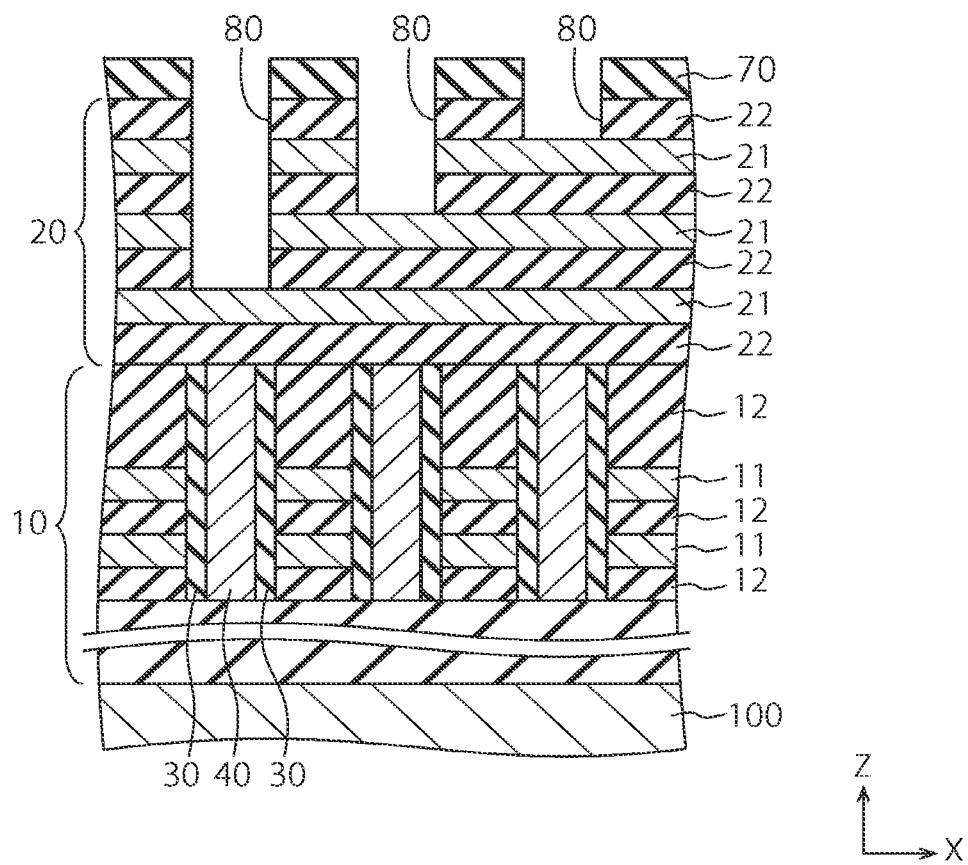
FIG. 7B is a cross sectional view taken along a section line A5-A5 in FIG. 7A.

Next, etching is applied to the second stacked body 20 through the hole portions 71 by, for example, reactive ion etching (RIE) as illustrated in FIG. 7A and FIG. 7B. This causes a plurality of first contact holes 80 with respective different depths to be formed. The first contact holes 80 are each terminated at the second electrode layer 21 to be connected in accordance with the depth of corresponding one of the hole portions 71. The mask 70 is then removed.

Figure 8A:
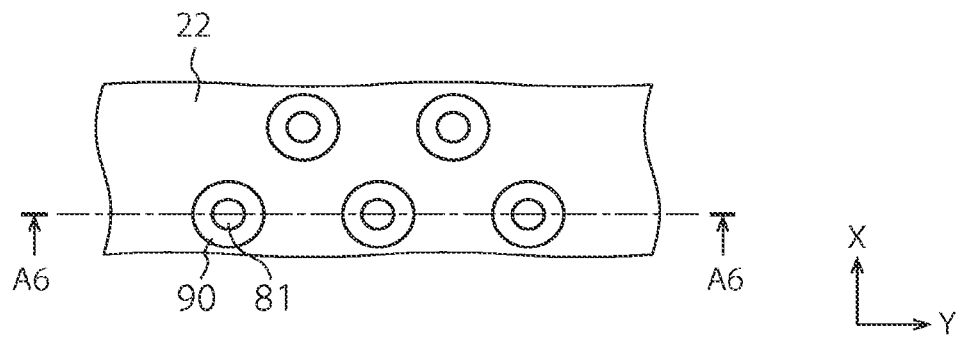
FIG. 8A is a plan view illustrating a formation process of a second contact hole.
Figure 8B:
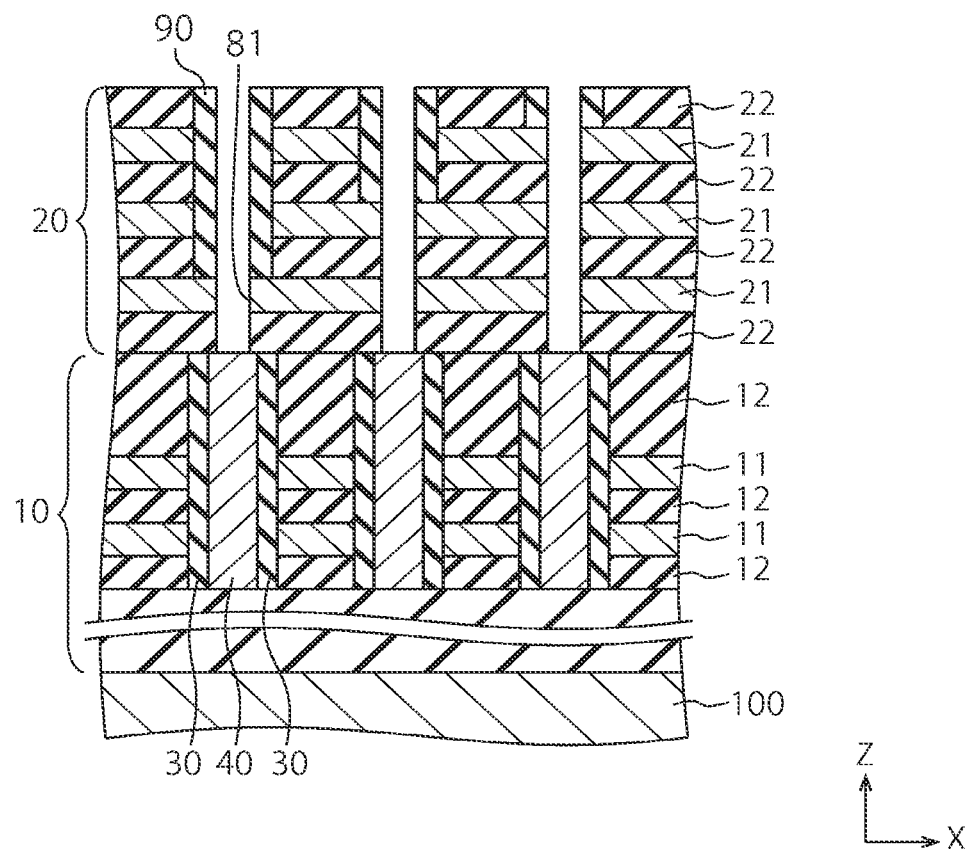
FIG. 8B is a cross sectional view taken along a section line A6-A6 in FIG. 8A.

Next, a sacrificial layer 90 is formed on a side surface of each of the first contact holes 80 and etching is applied to the second stacked body 20 by using the sacrificial layer 90 as a mask as illustrated in FIG. 8A and FIG. 8B. This causes second contact holes 81 having a smaller diameter than the first contact holes 80 to be formed. The sacrificial layer 90 contains, for example, silicon nitride. In addition, upper ends of the second contact holes 81 are in communication with the first contact holes 80, whereas lower ends thereof reach the semiconductor films 40.

Figure 9A:
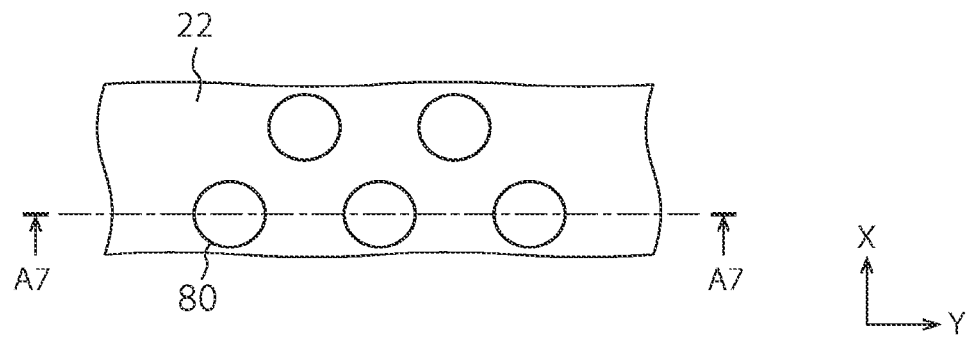
FIG. 9A is a plan view illustrating a removal process of a sacrificial layer.
Figure 9B:
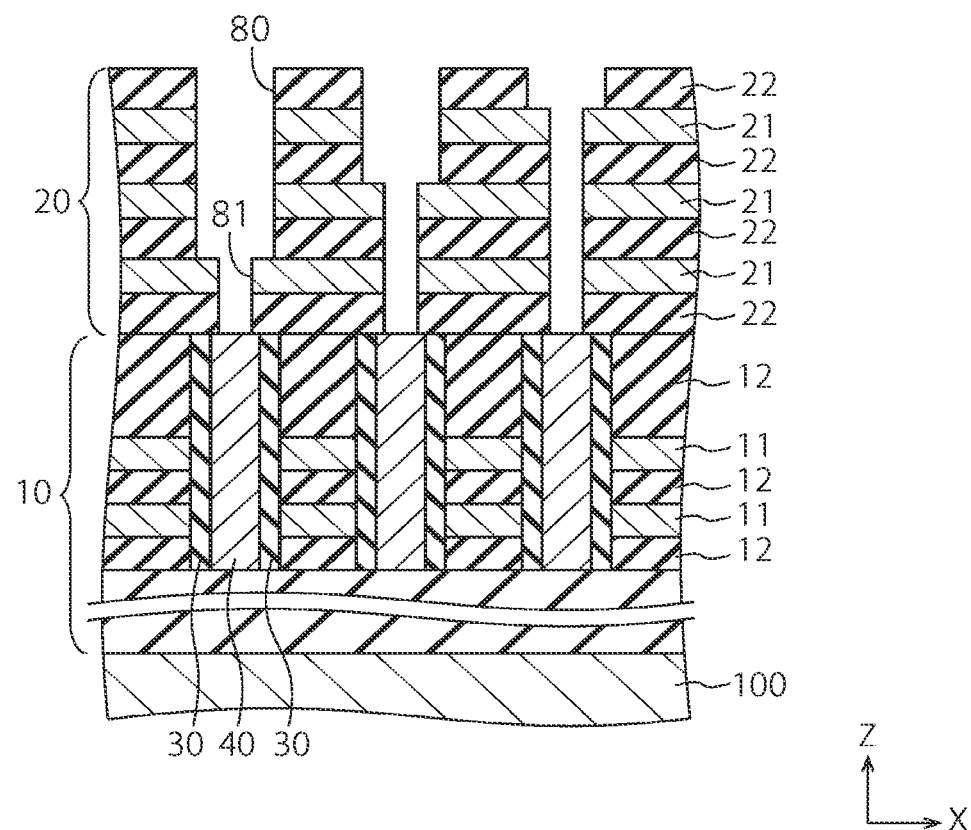
FIG. 9B is a cross sectional view taken along a section line A7-A7 in FIG. 9A.

Next, the sacrificial layer 90 is removed by, for example, wet etching as illustrated in FIG. 9A and FIG. 9B. This causes the first contact holes 80 and the second contact holes 81 to be exposed.

Figure 10A:
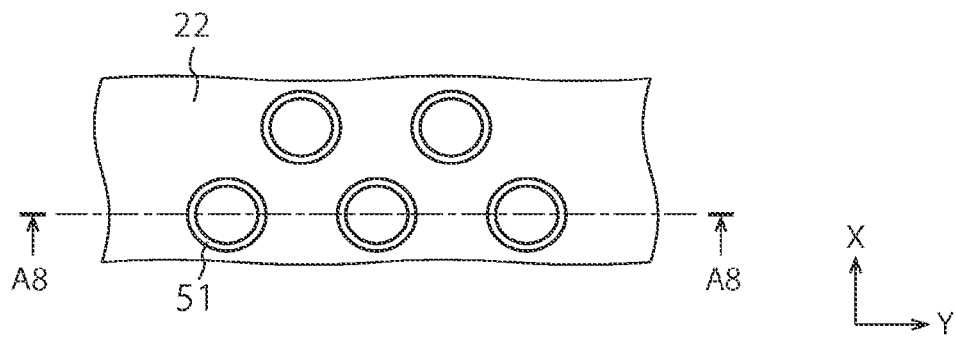
FIG. 10A is a plan view illustrating a formation process of an insulating film.
Figure 10B:
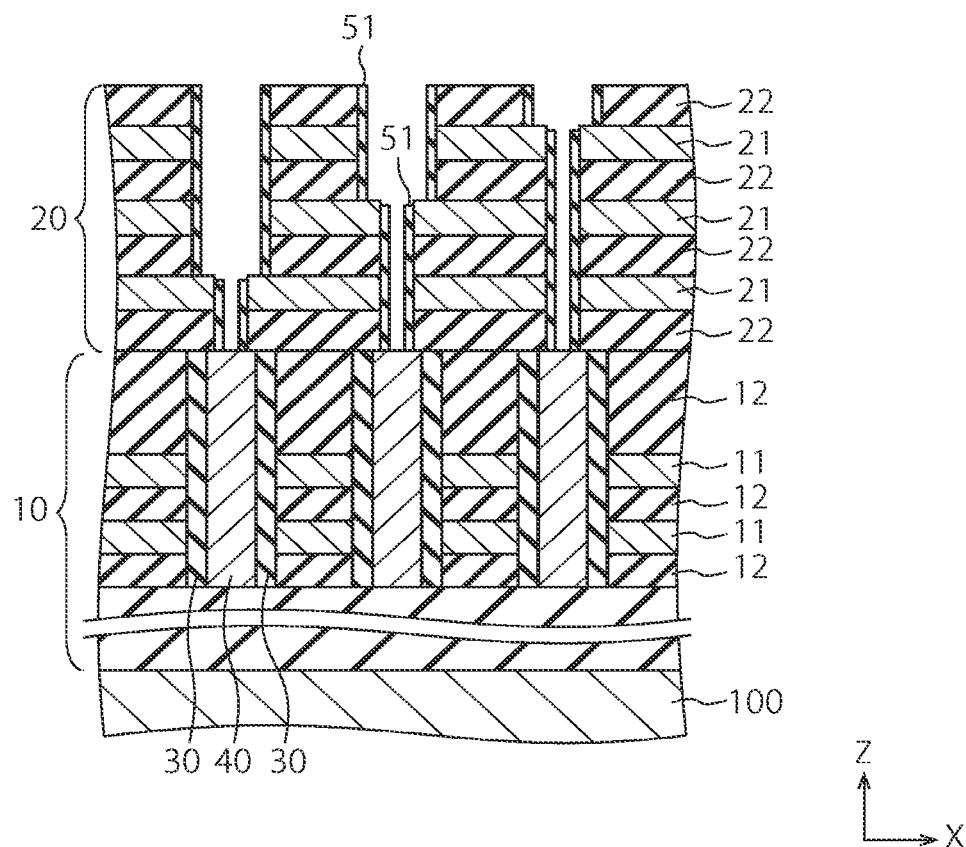
FIG. 10B is a cross sectional view taken along a section line A8-A8 in FIG. 10A.

Next, the insulating film 51 is formed on each of the side surfaces of the first contact holes 80 and side surfaces of the second contact holes 81 as illustrated in FIG. 10A and FIG. 10B.

Figure 11A:
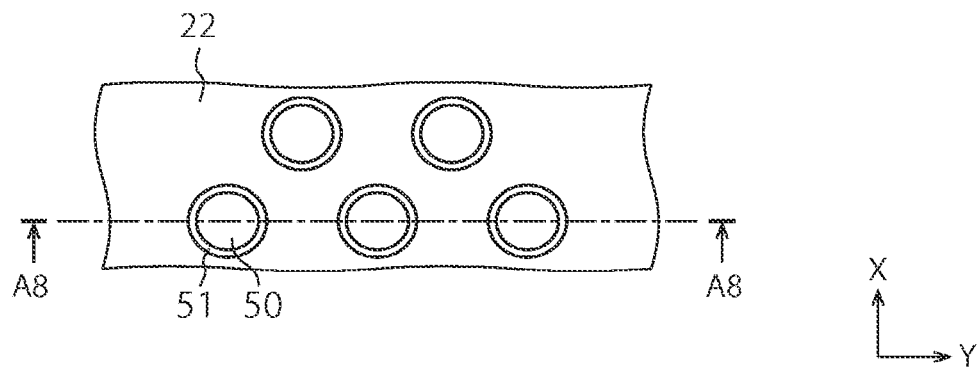
FIG. 11A is a plan view illustrating a formation process of a contact plug.
Figure 11B:
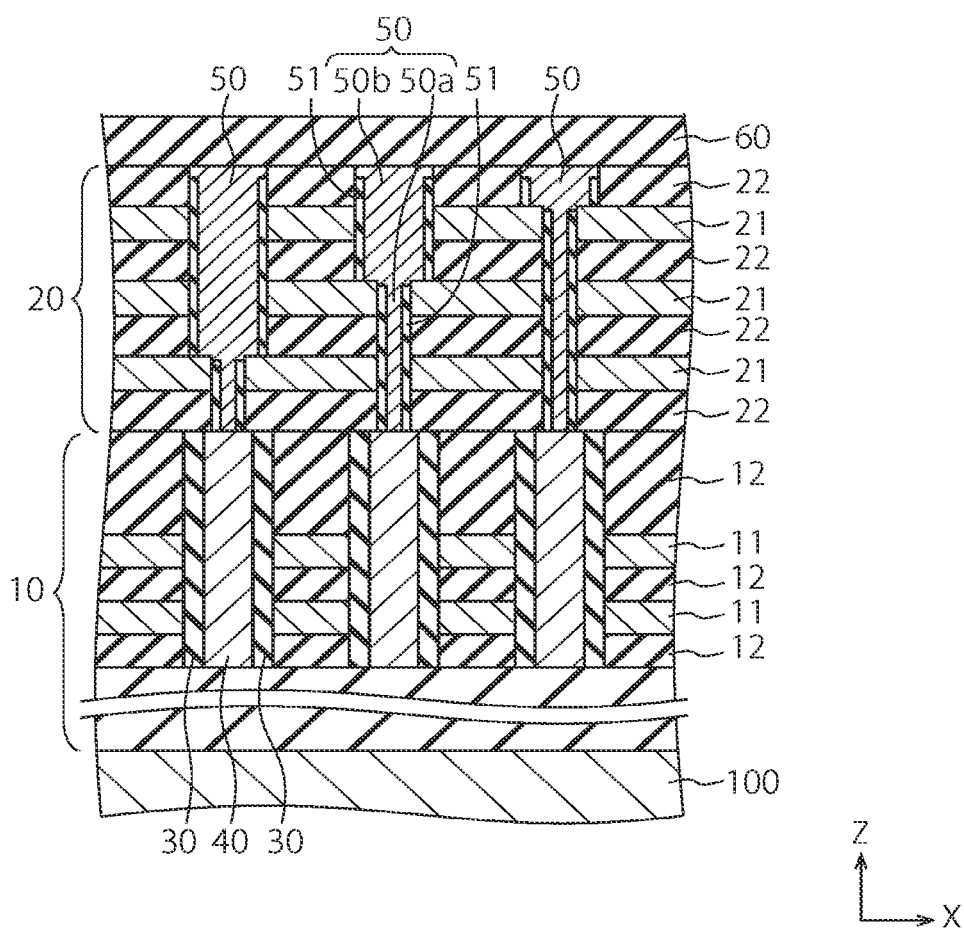
FIG. 11B is a cross sectional view taken along a section line A9-A9 in FIG. 11A.

Next, the contact plugs 50 are formed and, further, the protecting film 60 is formed on the second stacked body 20 as illustrated in FIG. 11A and FIG. 11B. The contact plugs 50 can be formed by, for example, embedding a metal material such as tungsten in the first contact holes 80 and the second contact holes 81 and applying chemical machining polishing (CMP) to a surface of a metal film.

At the end, the second stacked body 20 is lined in the X-direction, dividing the second electrode layers 21 as illustrated in FIG. 2A and FIG. 2B.

A semiconductor storage device according to a comparative example will be described below in comparison with the above-described semiconductor storage device 1 according to the present embodiment.

Figure 12:
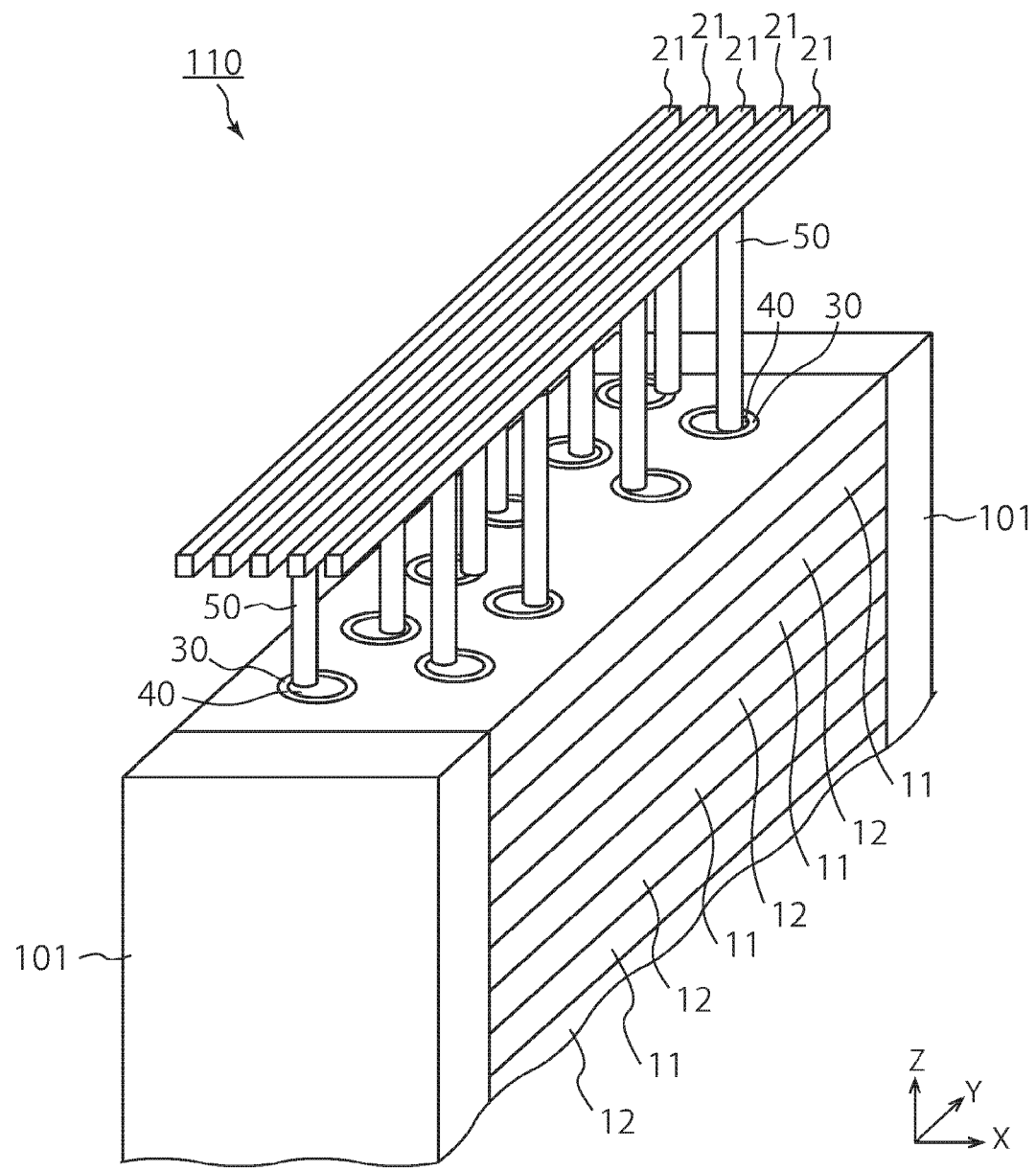
FIG. 12 is a perspective view illustrating a structure of a semiconductor storage device according to a comparative example.

FIG. 12 is a perspective view illustrating a structure of a semiconductor storage device 110 according to the comparative example. Components similar to those of the semiconductor storage device 1 as illustrated in FIG. 1 are referred to with the same signs and detailed descriptions thereof will be omitted.

In the semiconductor storage device 110 according to the comparative example, the plurality of semiconductor films 40 belonging to the same rows in the Y-direction are connected to the respective second electrode layers 21 (bit lines) arranged in the X-direction. Accordingly, an increase in the stacking number of the first electrode layers 11 (word lines) necessitates miniaturization of the second electrode layers 21 in order to ensure X-direction intervals between the second electrode layers 21. In this case, a contact area between the second electrode layers 21 and the contact plugs 50 decreases, which increases an electric resistance. In addition, positions of the contact plugs 50 relative to the semiconductor films 40 have a limitation, which would cause an incident of the second electrode layers 21 and the semiconductor films 40 failing to be electrically connected to each other.

However, in the present embodiment, the second electrode layers 21 are stacked in the Z-direction as illustrated in FIG. 1. This eliminates the necessity of miniaturization of the second electrode layers 21 even when the stacking number of the first electrode layers 11 is increased, so that contact areas between the second electrode layers 21 and the contact plugs 50 are sufficiently ensured. This makes it possible to reduce an increase in electric resistance. In addition, by virtue of positions of the contact plugs 50 relative to the semiconductor films 40 having no limitation, it is possible to sufficiently ensure an electrical connection between the second electrode layers 21 and the semiconductor films 40.

Modification Example

A method of manufacturing a semiconductor storage device according to a modification example will be described below with reference to FIG. 13 to FIG. 25. It should be noted that components similar to those of the above-described first embodiment are referred to with the same signs and detailed descriptions thereof will be omitted.

First, the first stacked body 10, the memory films 30, and the semiconductor films 40 are formed on the substrate 100 as in the first embodiment.

Figure 13A:
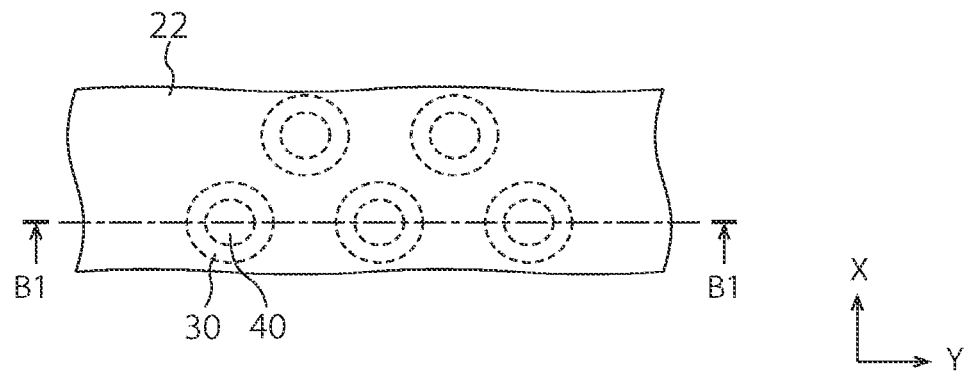
FIG. 13A is a plan view illustrating a formation process of a second stacked body according to a modification example.
Figure 13B:
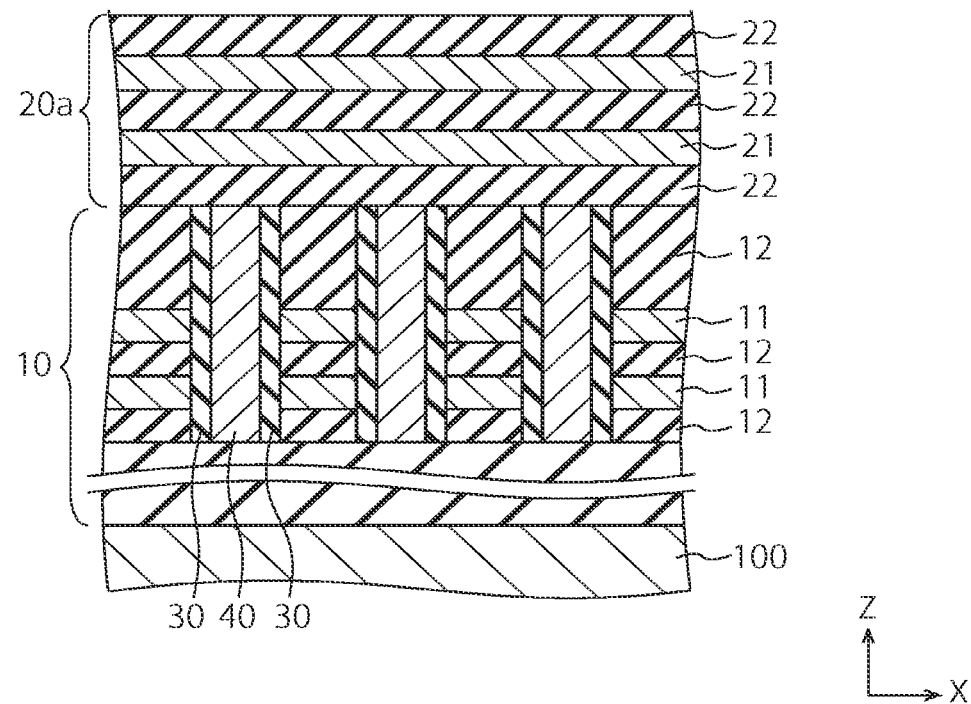
FIG. 13B is a cross sectional view taken along a section line B1-B1 in FIG. 13A.

Next, a second stacked body 20a is formed on the first stacked body 10 as illustrated in FIG. 13A and FIG. 13B. The second stacked body 20a is different from the second stacked body 20 according to the first embodiment in that no uppermost second electrode layer 21 is formed.

Figure 14A:
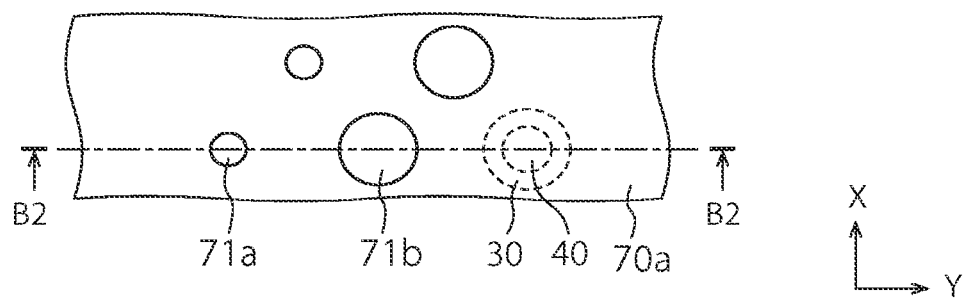
FIG. 14A is a plan view illustrating a formation process of a mask according to the modification example.
Figure 14B:
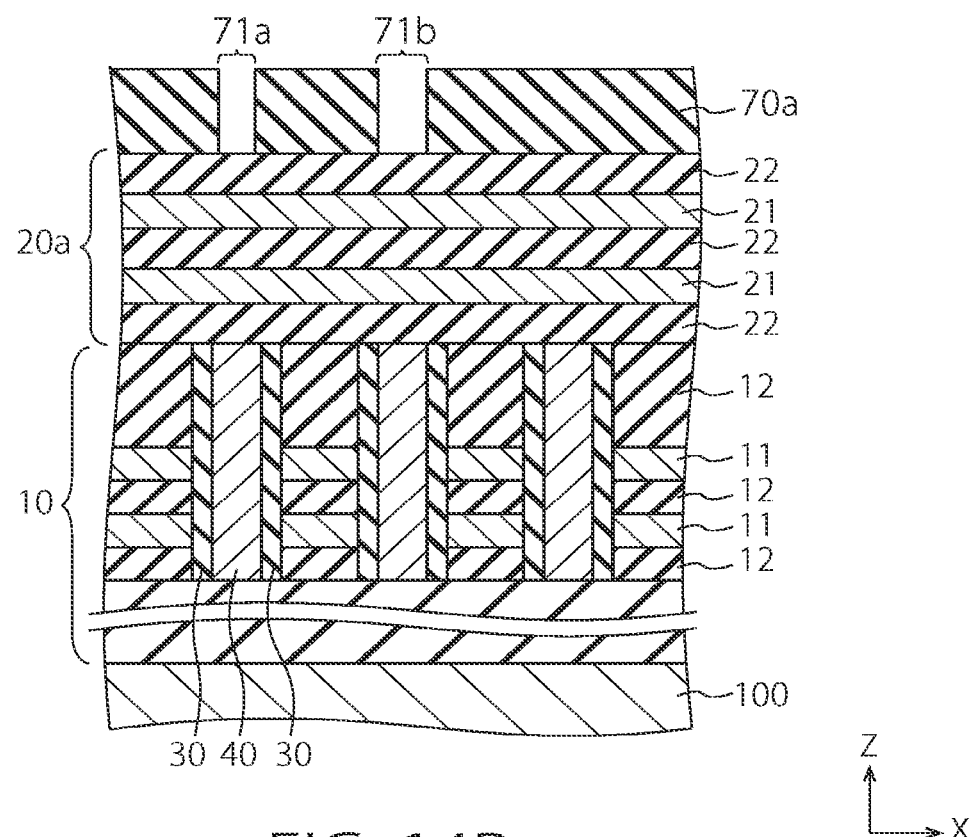
FIG. 14B is a cross sectional view taken along a section line B2-B2 in FIG. 14A.

Next, a mask 70a is formed on the second stacked body 20 as illustrated in FIG. 14A and FIG. 14B. A hole portion 71a and a hole portion 71b are formed in the mask 70a. An opening diameter of the hole portion 71b is larger than an opening diameter of the hole portion 71a. Meanwhile, depths of the hole portion 71a and the hole portion 71b are equal to each other.

Figure 15A:
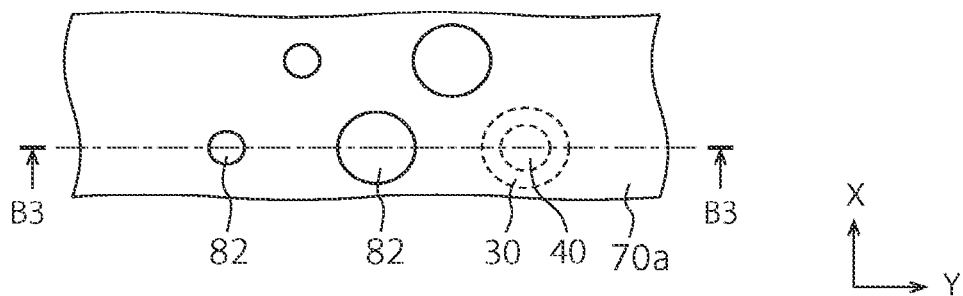
FIG. 15A is a plan view illustrating a formation process of a first contact hole according to the modification example.
Figure 15B:
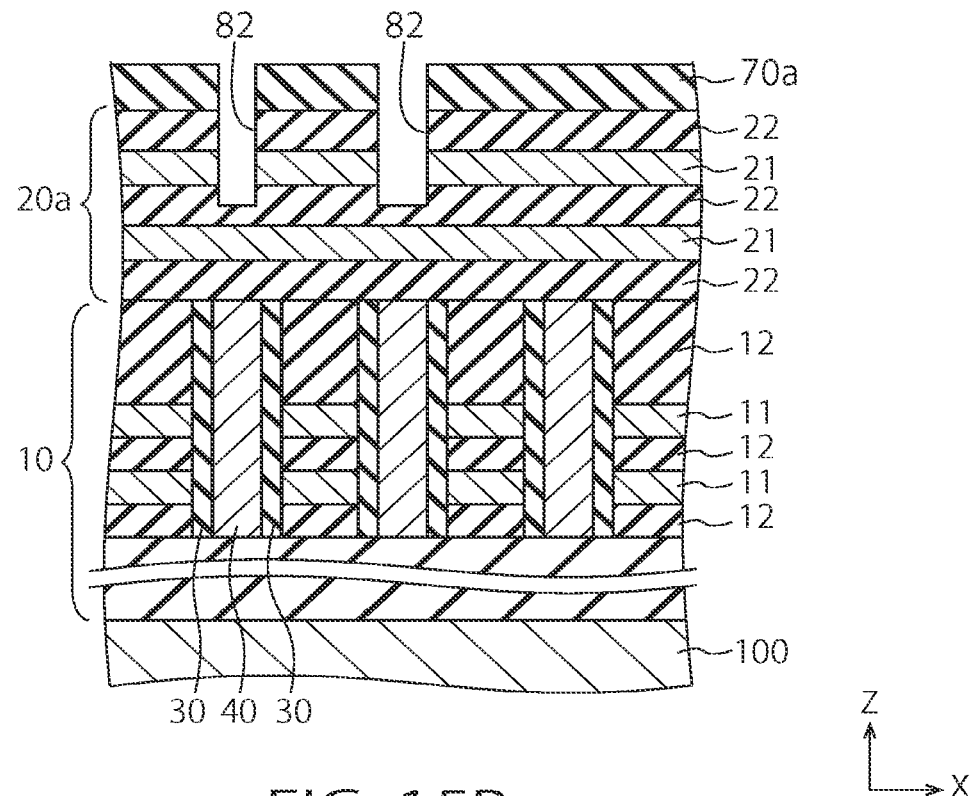
FIG. 15B is a cross sectional view taken along a section line B3-B3 in FIG. 15A.

Next, as illustrated in FIG. 15A and FIG. 15B, etching is applied to the second stacked body 20 through the hole portion 71a and the hole portion 71b by, for example, RIE, thereby forming a plurality of first contact holes 82 with respective different opening diameters. The first contact holes 82 are terminated in the second insulating layer 22 formed on the lowermost second electrode layer 21.

Figure 16A:
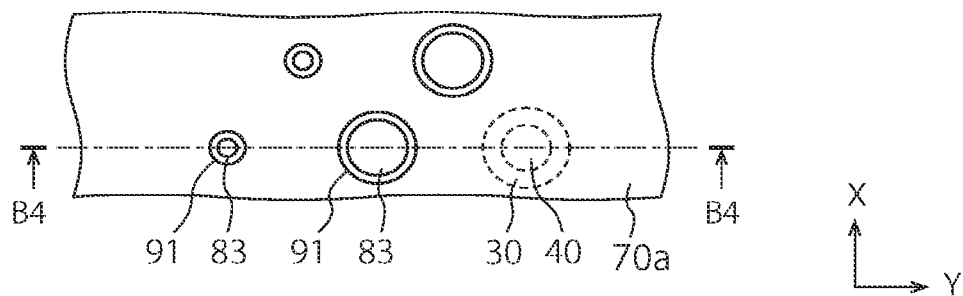
FIG. 16A is a plan view illustrating a formation process of a second contact hole according to the modification example.
Figure 16B:
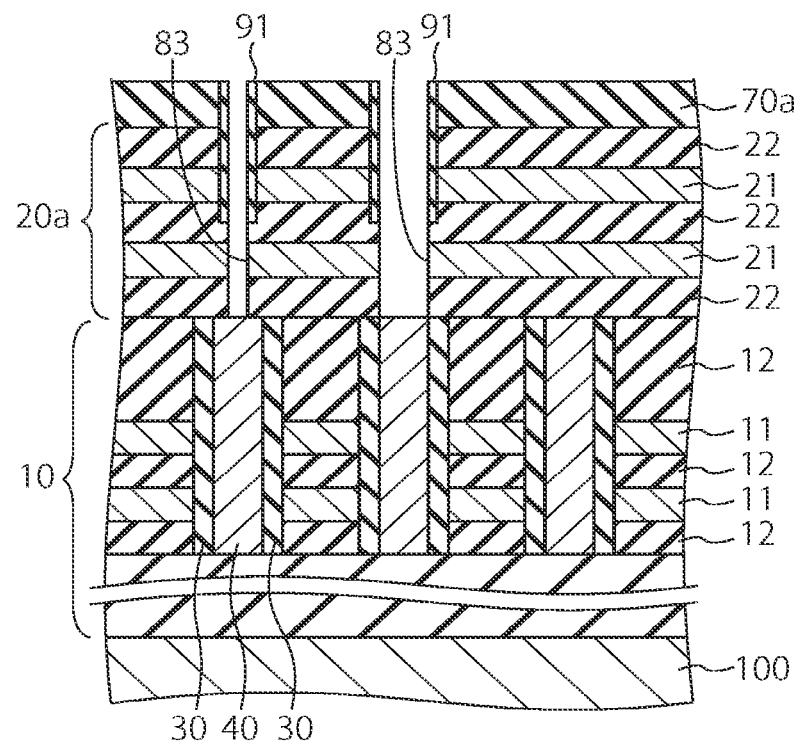
FIG. 16B is a cross sectional view taken along a section line B4-B4 in FIG. 16A.

Next, a sacrificial layer 91 is formed on a side surface of each of the first contact holes 82 and etching is applied to the second stacked body 20 by using the sacrificial layer 91 as a mask as illustrated in FIG. 16A and FIG. 16B. This causes second contact holes 83 having a smaller diameter than the first contact holes 82 to be formed. Upper ends of the second contact holes 83 are in communication with the first contact holes 82, whereas lower ends thereof reach the semiconductor films 40.

Figure 17A:
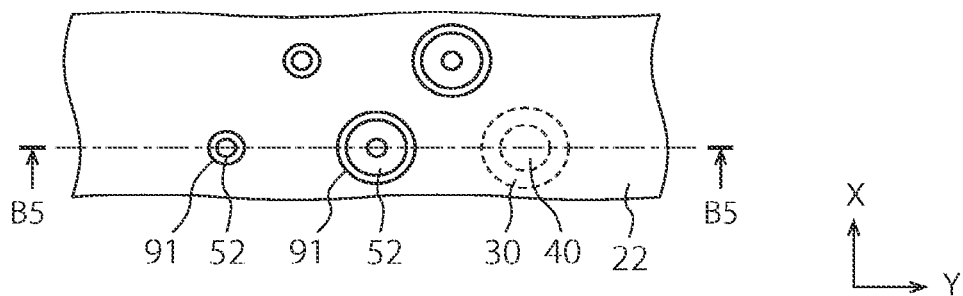
FIG. 17A is a plan view illustrating a formation process of a metal film according to the modification example.
Figure 17B:
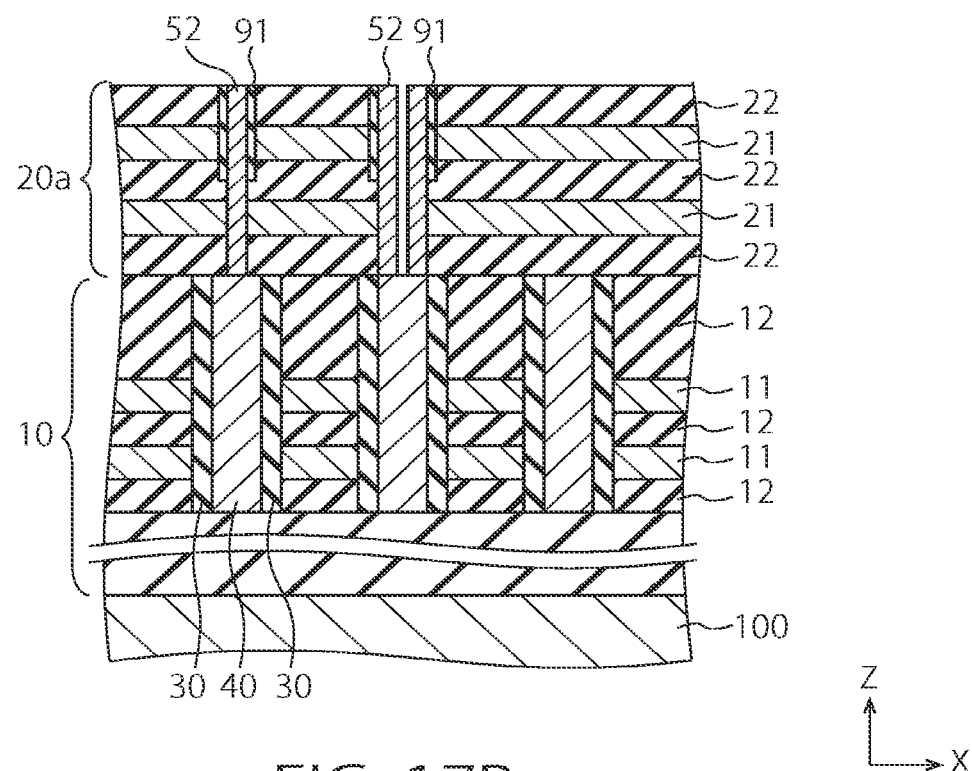
FIG. 17B is a cross sectional view taken along a section line B5-B5 in FIG. 17A.

Next, a metal film 52 is formed as illustrated in FIG. 17A and FIG. 17B. At this time, the first contact hole 82 and the second contact hole 83 having small opening diameters are filled with the metal film 52. In contrast, in the first contact hole 82 and the second contact hole 83 having large opening diameters, the metal film 52 is formed on the sacrificial layer 91 or on the side surface of the second contact hole 83 with the inside of the contact holes not being fully filled.

Figure 18A:
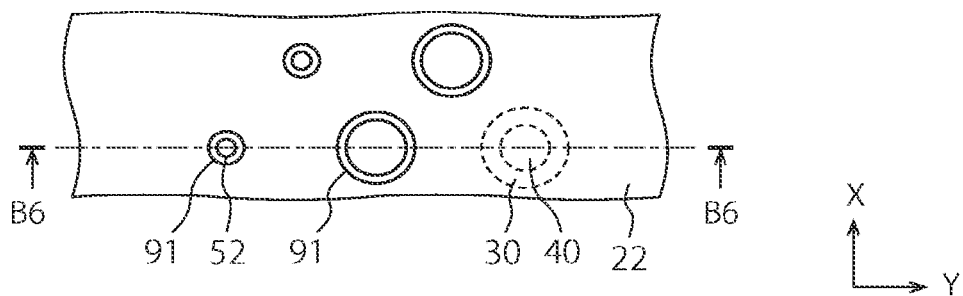
FIG. 18A is a plan view illustrating a removal process of the metal film according to the modification example.
Figure 18B:
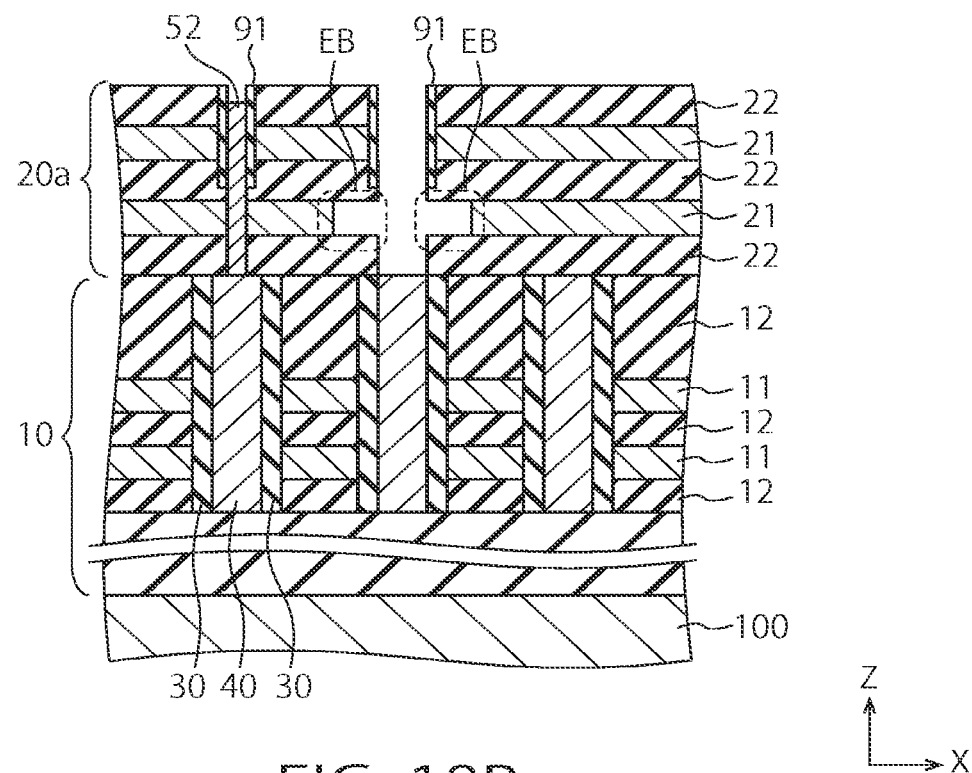
FIG. 18B is a cross sectional view taken along a section line B6-B6 in FIG. 18A.

Next, the metal film 52 is removed by, for example, wet etching as illustrated in FIG. 18A and FIG. 18B. At this time, in the first contact hole 82 and the second contact hole 83 having the small opening diameters, only an upper portion of the metal film 52 is etched. In contrast, in the first contact hole 82 and the second contact hole 83 having the large opening diameters, the metal film 52 is fully removed. Further, an etch-back region EB, in which the lowermost second electrode layer 21 is partially etched, is formed.

Figure 19A:
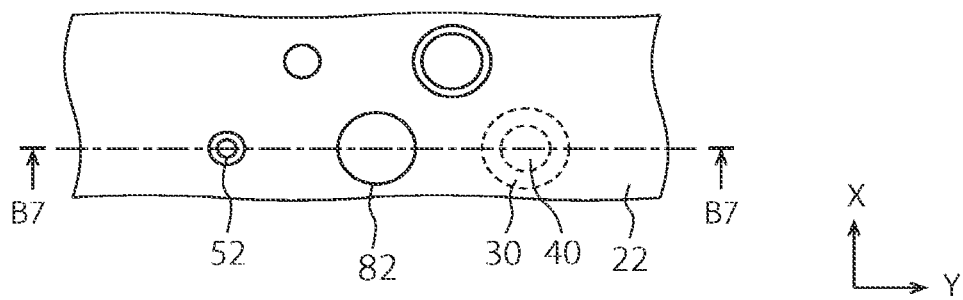
FIG. 19A is a plan view illustrating a removal process of a sacrificial layer according to the modification example.
Figure 19B:
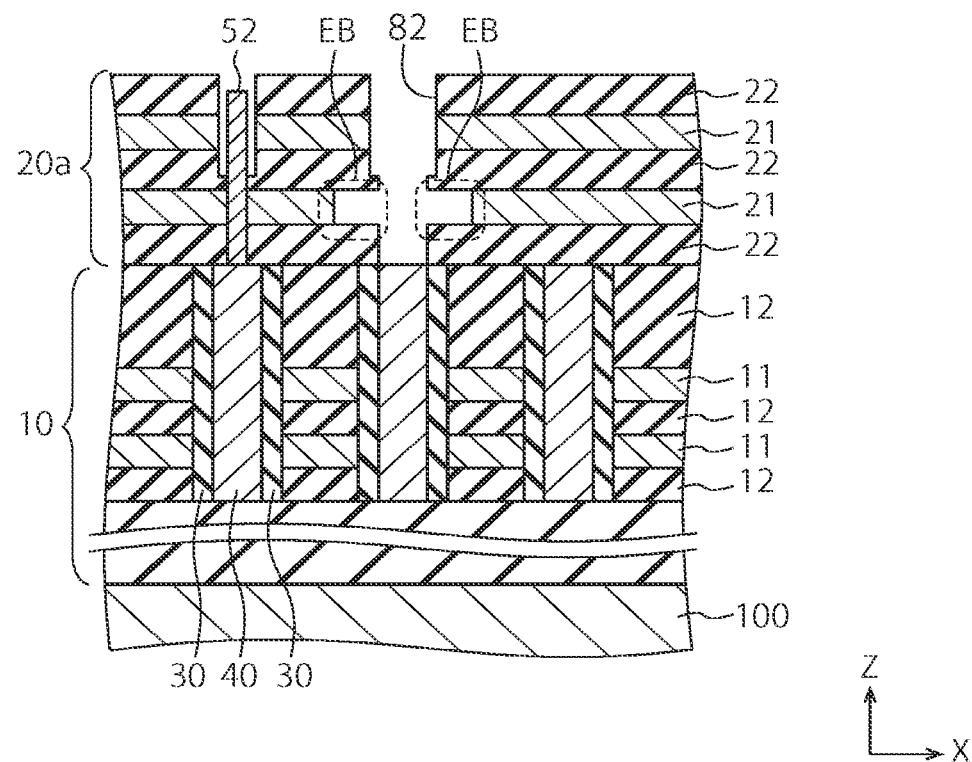
FIG. 19B is a cross sectional view taken along a section line B7-B7 in FIG. 19A.

Next, the sacrificial layer 91 is removed as illustrated in FIG. 19A and FIG. 19B.

Figure 20A:
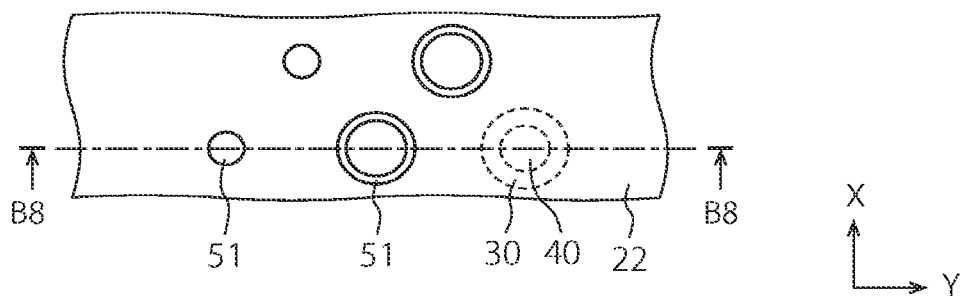
FIG. 20A is a plan view illustrating a formation process of an insulating film according to the modification example.
Figure 20B:
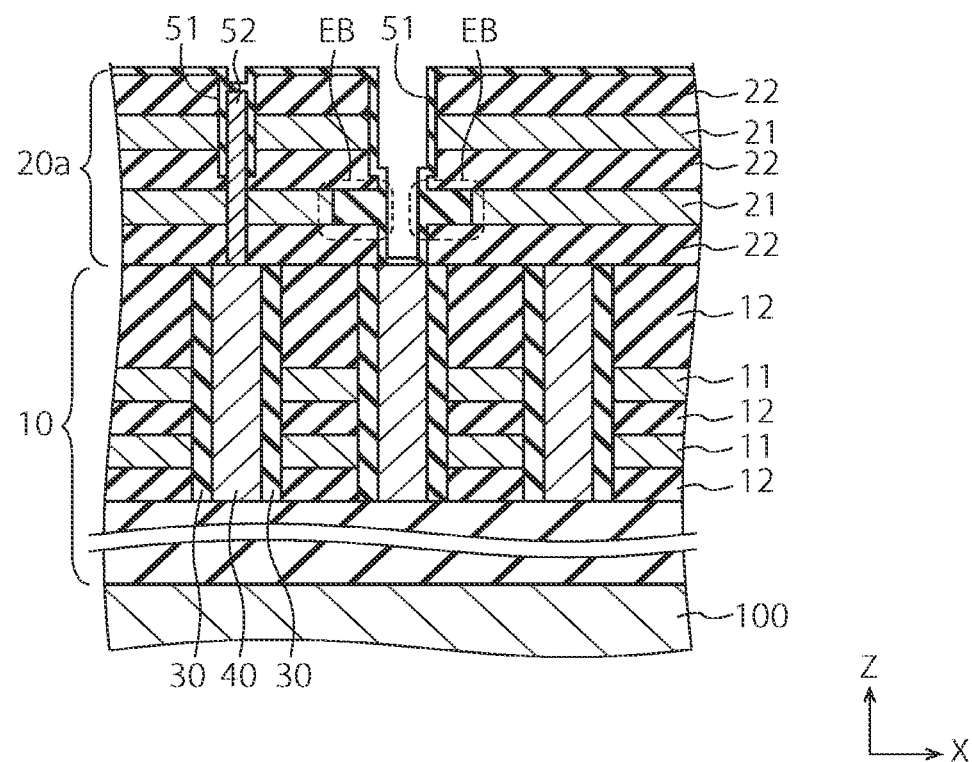
FIG. 20B is a cross sectional view taken along a section line B8-B8 in FIG. 20A.

Next, the insulating film 51 is formed as illustrated in FIG. 20A and FIG. 20B. The insulating film 51 is formed at an etching spot of the sacrificial layer 91, the etch-back region EB, etc.

Figure 21A:
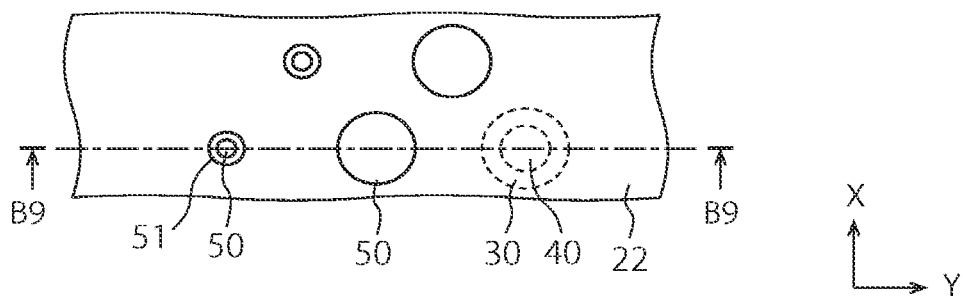
FIG. 21A is a plan view illustrating a formation process of an insulating film according to the modification example.
Figure 21B:
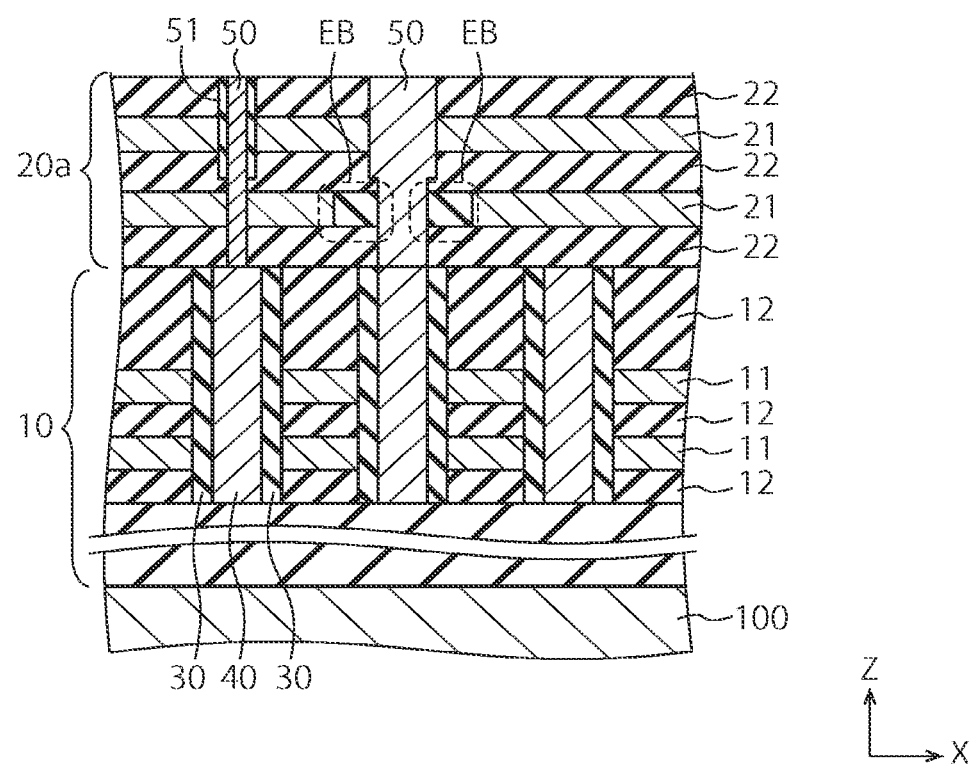
FIG. 21B is a cross sectional view taken along a section line B9-B9 in FIG. 21A.

Next, the contact plugs 50 are formed as illustrated in FIG. 21A and FIG. 21B. Here, the insulating film 51 is first removed by wet etching. However, in the first contact hole 82 and the second contact hole 83 having the small opening diameters, the insulating film 51 provided on the second electrode layer 21 immediately above the lowermost second electrode layer 21 is left. In addition, in the first contact hole 82 and the second contact hole 83 having the large opening diameter, the insulating film 51 formed in the etch-back region EB is also left. Subsequently, the same metal material as that of the metal film 52 is embedded in the first contact hole 82 and the second contact hole 83 and chemical machining polishing is applied to a surface of a metal film. The contact plugs 50 are thus completed.

Figure 22A:
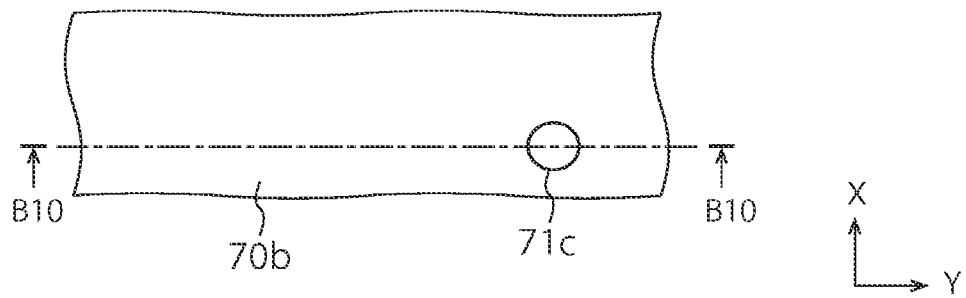
FIG. 22A is a plan view illustrating a formation process of a third hole according to the modification example.
Figure 22B:
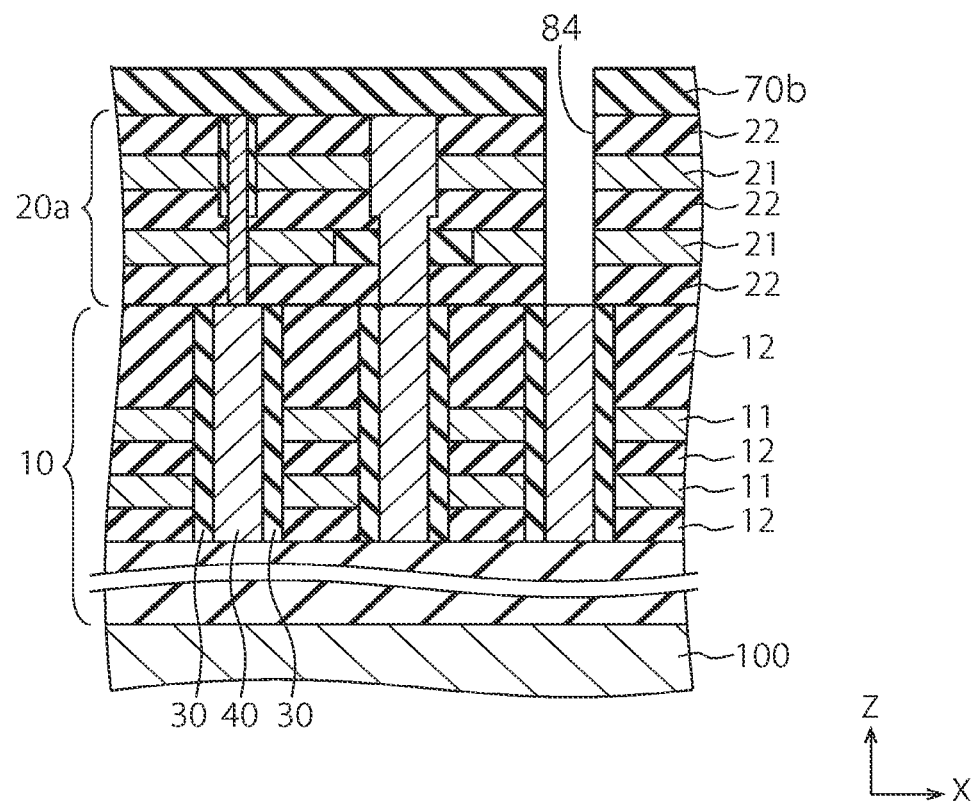
FIG. 22B is a cross sectional view taken along a section line B10-B10 in FIG. 22A.

Next, a third hole 84 is formed as illustrated in FIG. 22A and FIG. 22B. The third hole 84 is formed on the semiconductor film 40 that is not connected to any of the contact plugs 50. The third hole 84 is formed by etching the second stacked body 20a with a mask 70b having an opening portion 71c. A lower end of the third hole 84 reaches the semiconductor film 40.

Figure 23A:
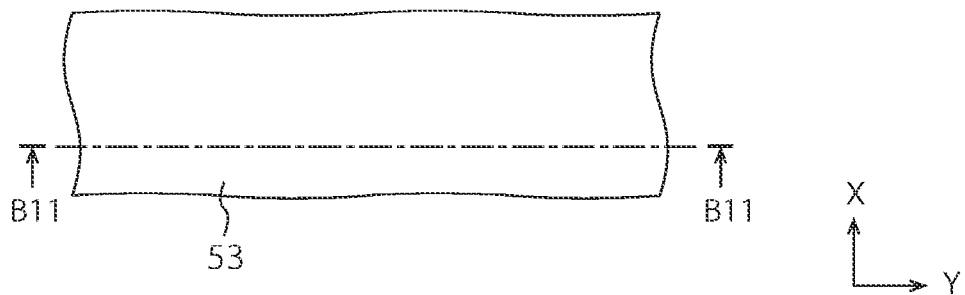
FIG. 23A is a plan view illustrating a formation process of a metal film according to the modification example.
Figure 23B:
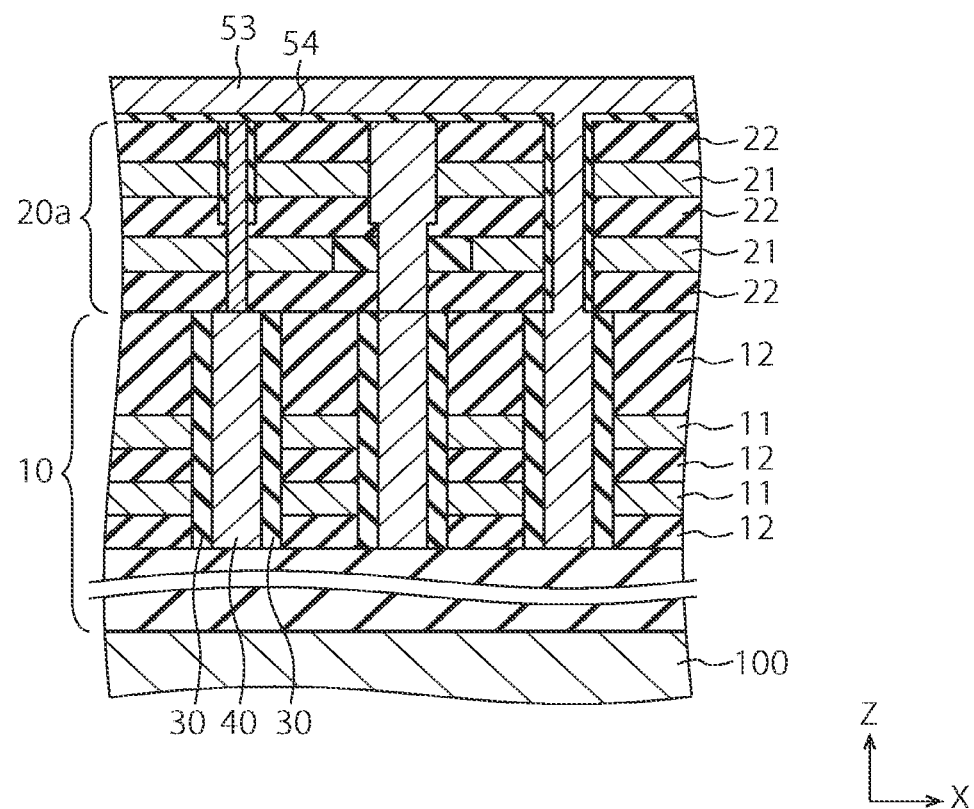
FIG. 23B is a cross sectional view taken along a section line B11-B11 in FIG. 23A.

Next, a metal film 53 is formed as illustrated in FIG. 23A and FIG. 23B. Here, an insulating film 54 containing silicon oxide is first formed on an upper surface of the second stacked body 20a and a side surface of the third hole 84. Subsequently, the metal film 53, which contains the same metal material as the second electrode layers 21, is formed on the insulating film 54. The metal film 53 formed on the upper surface of the second stacked body 20a corresponds to the uppermost second electrode layer 21. Meanwhile, the metal film 53 that fills the inside of the third hole 84 corresponds to the contact plug 50 connected to the uppermost second electrode layer 21.

Figure 24A:
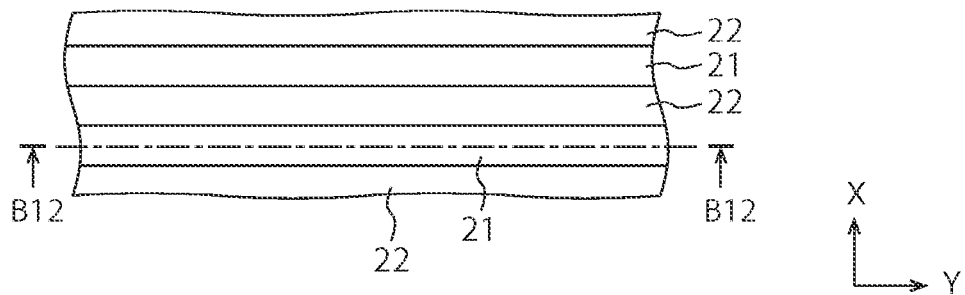
FIG. 24A is a plan view illustrating a lining process of a metal film according to the modification example.
Figure 24B:
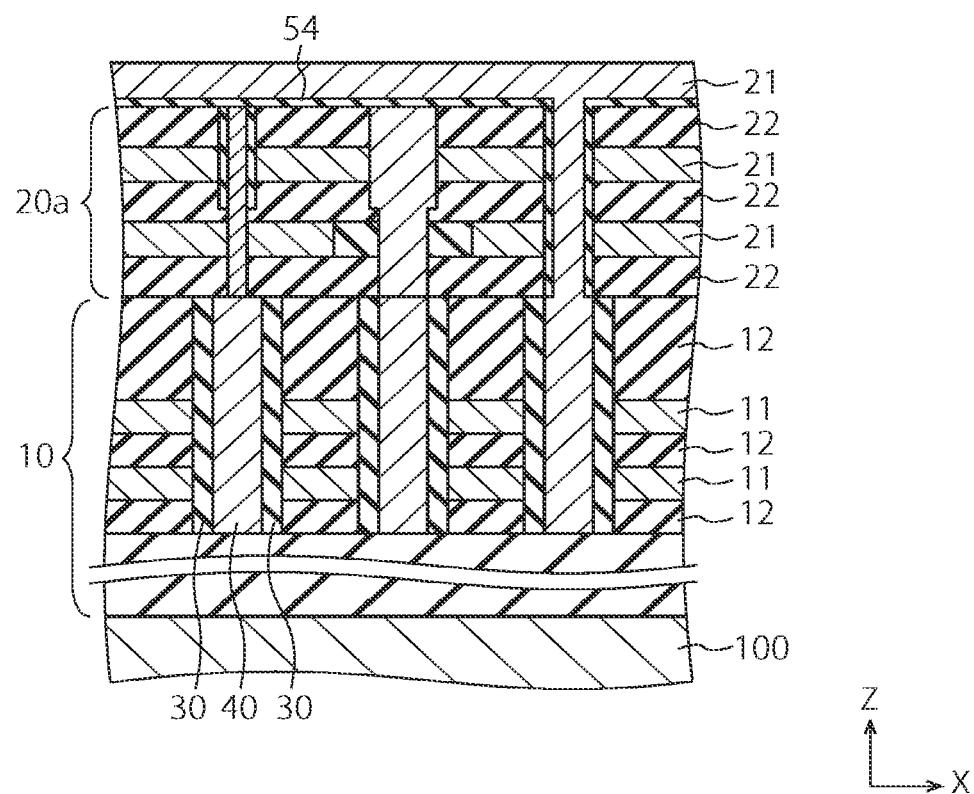
FIG. 24B is a cross sectional view taken along a section line B12-B12 in FIG. 24A.

Next, the metal film 53 formed on the upper surface of the second stacked body 20a is lined in the X-direction as illustrated in FIG. 24A and FIG. 24B. The uppermost second electrode layer 21 is thus completed.

Figure 25:
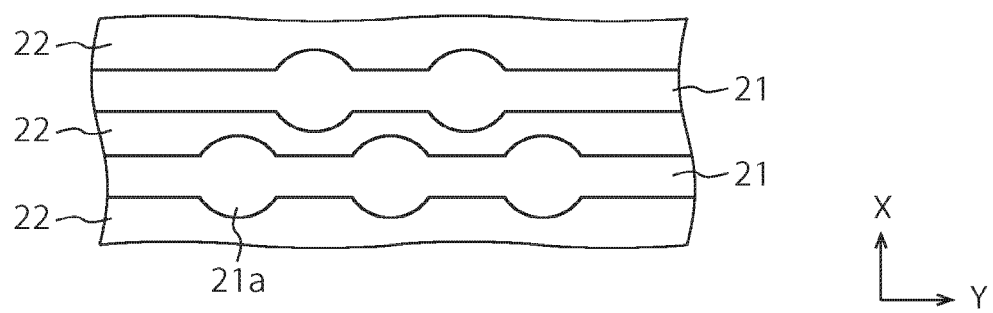
FIG. 25 is a plan view illustrating another lining process of a metal film.

It should be noted that in the present modification example, the metal film 53 may be machined to cause the second electrode layers 21 to have connection regions 21a as illustrated in FIG. 25. In this case, the connection regions 21a, which are to be connected to the contact plugs 50, have wider areas than other regions, which makes it possible to ensure a sufficient connection margin.

Even in the present modification example described above, the second electrode layers 21 can be stacked in the Z-direction. This eliminates the necessity of miniaturization of the second electrode layers 21 even when the stacking number of the first electrode layers 11 is increased as in the first embodiment. Hence, it is possible to reduce an increase in electric resistance and sufficiently ensure an electrical connection between the second electrode layers 21 and the semiconductor films 40.

Second Embodiment

Figure 26:
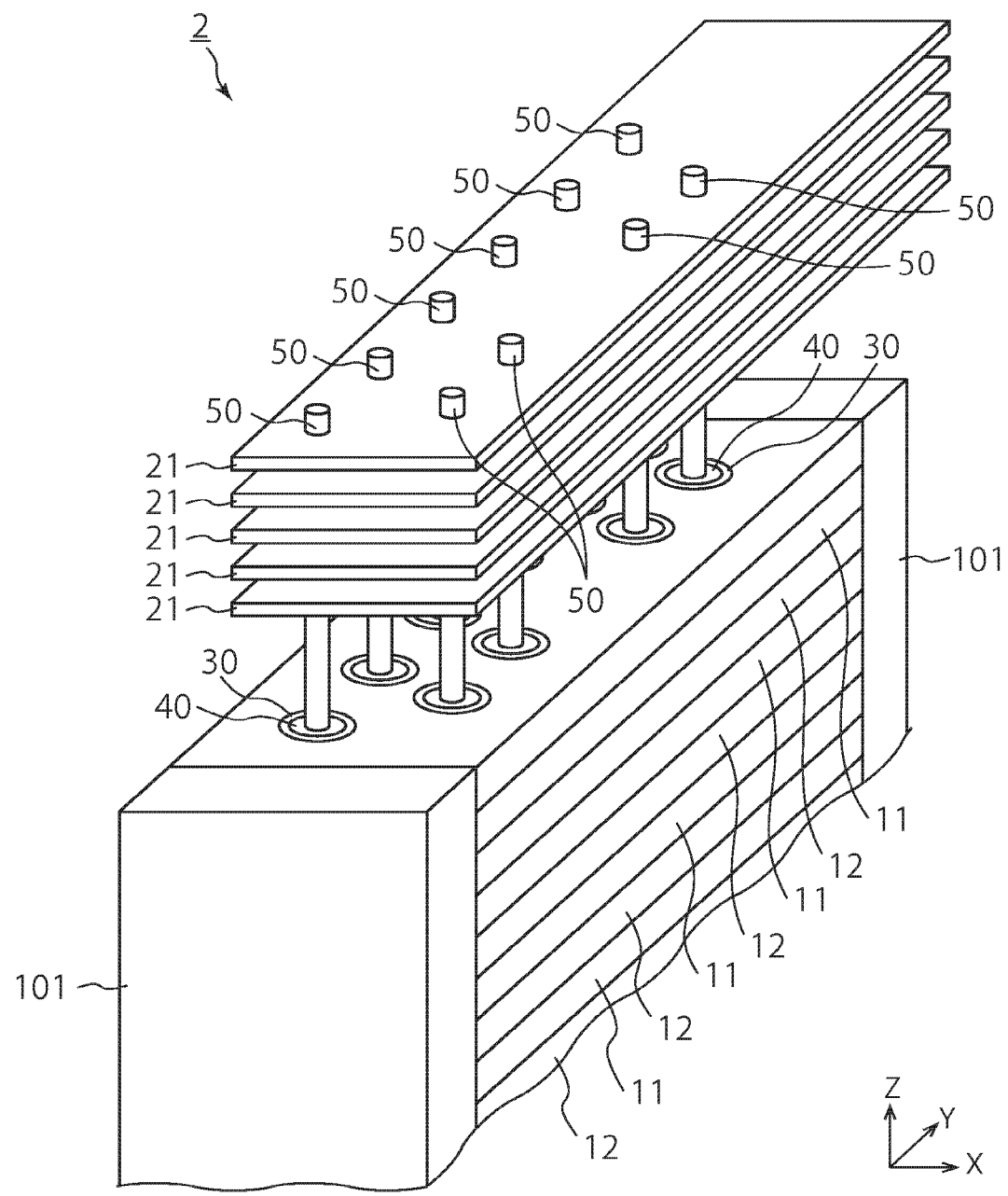
FIG. 26 is a perspective view illustrating a structure of a main part of a semiconductor storage device according to a second embodiment.

FIG. 26 is a schematic perspective view of a semiconductor storage device according to a second embodiment. In FIG. 26, components similar to those of the semiconductor storage device 1 according to the first embodiment as illustrated in FIG. 1 are referred to with the same signs and detailed descriptions thereof will be omitted.

In the above-described first embodiment, the second electrode layers 21 are provided for each row of the semiconductor films 40 arranged in the Y-direction. That is to say, a stacked block of the second electrode layers 21 is provided for each row of the semiconductor films 40.

In contrast, a semiconductor storage device 2 according to the present embodiment, a stacked block of the second electrode layers 21 is provided in common for a plurality of rows of the semiconductor films 40 adjacent in the X-direction as illustrated in FIG. 26. At this time, the semiconductor films 40 are each electrically connected to one of the plurality of stacked second electrode layers 21 as in the first embodiment. It should be noted that the semiconductor storage device 2 according to the present embodiment can be manufactured by a manufacturing method similar to those of the first embodiment and the modification example described above.

According to the above-described present embodiment, the second electrode layers 21 are stacked as in the first embodiment, which eliminates the necessity of miniaturization of the second electrode layers 21 even when the stacking number of the first electrode layers 11 is increased. Therefore, it is possible to reduce an increase in electric resistance and sufficiently ensure an electrical connection between the second electrode layers 21 and the semiconductor films 40.

Further, according to the present embodiment, an area of the second electrode layers 21 is increased as compared with in the first embodiment, which makes it possible to also reduce an electric resistance of the second electrode layers 21.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a first stacked body comprising a plurality of first electrode layers and a plurality of first insulating layers that are alternately stacked on a substrate in a first direction perpendicular to the substrate;
a plurality of semiconductor films penetrating the first stacked body in the first direction;
a second stacked body comprising a plurality of second electrode layers and a plurality of second insulating layers that are alternately stacked on the first stacked body in the first direction; and
a plurality of contact plugs penetrating the second stacked body in the first direction and separately connected to the respective plurality of semiconductor films and the respective plurality of second electrode layers, wherein
the plurality of contact plugs each comprise a first columnar portion and a second columnar portion having a larger diameter than the first columnar portion, the first columnar portion having a lower end connected to the semiconductor film, the first columnar portion having an upper end connected to a lower end of the second columnar portion, the second electrode layers each being connected to the contact plug at a boundary portion between the first columnar portion and the second columnar portion.

2. The semiconductor storage device according to claim 1, wherein a side surface of the first columnar portion and a side surface of the second columnar portion are each covered with an insulating film.

3. A semiconductor storage device comprising:
a first stacked body comprising a plurality of first electrode layers and a plurality of first insulating layers that are alternately stacked on a substrate in a first direction perpendicular to the substrate;
a plurality of semiconductor films penetrating the first stacked body in the first direction;
a second stacked body comprising a plurality of second electrode layers and a plurality of second insulating layers that are alternately stacked on the first stacked body in the first direction; and
a plurality of contact plugs penetrating the second stacked body in the first direction and separately connected to the respective plurality of semiconductor films and the respective plurality of second electrode layers, wherein
the plurality of semiconductor films are arranged in a second direction orthogonal to the first direction, and
the plurality of second electrode layers are provided for a row of the semiconductor films.

4. A semiconductor storage device comprising:
a first stacked body comprising a plurality of first electrode layers and a plurality of first insulating layers that are alternately stacked on a substrate in a first direction perpendicular to the substrate;
a plurality of semiconductor films penetrating the first stacked body in the first direction;
a second stacked body comprising a plurality of second electrode layers and a plurality of second insulating layers that are alternately stacked on the first stacked body in the first direction; and
a plurality of contact plugs penetrating the second stacked body in the first direction and separately connected to the respective plurality of semiconductor films and the respective plurality of second electrode layers, wherein
the plurality of first electrode layers are each a word line and the plurality of second electrode layers are each a bit line.

5. A manufacturing method of a semiconductor storage device, the manufacturing method comprising:
forming a first stacked body and a plurality of semiconductor films on a substrate, the first stacked body comprising a plurality of first electrode layers and a plurality of first insulating layers that are alternately stacked in a first direction, the plurality of semiconductor films penetrating the first stacked body in the first direction;
forming a second stacked body on the first stacked body, the second stacked body comprising a plurality of second electrode layers and a plurality of second insulating layers that are alternately stacked in the first direction;
forming a plurality of contact holes penetrating the second stacked body in the first direction; and
forming, in the plurality of contact holes, a plurality of contact plugs separately connecting the plurality of semiconductor films and the plurality of second electrode layers, wherein
the forming the plurality of contact holes comprises forming a plurality of first contact holes with respective different depths, forming a sacrificial layer on a side surface of each of the first contact holes, and forming second contact holes that are in communication with the respective first contact holes by using the sacrificial layer as a mask.

6. A manufacturing method of a semiconductor storage device, the manufacturing method comprising:
forming a first stacked body and a plurality of semiconductor films on a substrate, the first stacked body comprising a plurality of first electrode layers and a plurality of first insulating layers that are alternately stacked in a first direction, the plurality of semiconductor films penetrating the first stacked body in the first direction;
forming a second stacked body on the first stacked body, the second stacked body comprising a plurality of second electrode layers and a plurality of second insulating layers that are alternately stacked in the first direction;
forming a plurality of contact holes penetrating the second stacked body in the first direction; and
forming, in the plurality of contact holes, a plurality of contact plugs separately connecting the plurality of semiconductor films and the plurality of second electrode layers, wherein
the forming the plurality of contact holes comprises forming a plurality of first contact holes with respective different opening diameters, forming a sacrificial layer on a side surface of each of the first contact holes, and forming second contact holes that are in communication with the respective first contact holes by using the sacrificial layer as a mask, and
uppermost one of the second electrode layers and one of the contact plugs connected to the uppermost one of the second electrode layers are simultaneously formed.

* * * * *